US012628536B2

(12) United States Patent
Luo et al.

(10) Patent No.: US 12,628,536 B2
(45) Date of Patent: May 12, 2026

(54) DISPLAY APPARATUS AND NEAR-EYE DISPLAY DEVICE

(71) Applicant: SeeYA Optronics Co., Ltd., Shanghai (CN)

(72) Inventors: Liyuan Luo, Shanghai (CN); Run Yang, Shanghai (CN); Peng Yan, Shanghai (CN); Zhongshou Huang, Shanghai (CN); Meng Cui, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 394 days.

(21) Appl. No.: 18/487,989

(22) Filed: Oct. 16, 2023

(65) Prior Publication Data

US 2024/0224755 A1 Jul. 4, 2024

(30) Foreign Application Priority Data

Dec. 30, 2022 (CN) .......................... 202211737635.0

(51) Int. Cl.
H10K 59/80 (2023.01)
G06F 1/16 (2006.01)
(Continued)

(52) U.S. Cl.
CPC ........... H10K 59/879 (2023.02); G06F 1/163 (2013.01); G02B 3/0006 (2013.01); G02B 27/0172 (2013.01); H10K 59/35 (2023.02)

(58) Field of Classification Search
None
See application file for complete search history.

(56) References Cited

U.S. PATENT DOCUMENTS

2022/0209197 A1* 6/2022 Luo ...................... H10K 59/121

FOREIGN PATENT DOCUMENTS

CN 110164938 A 8/2019
CN 110429126 A 11/2019
(Continued)

OTHER PUBLICATIONS

Chinese Notice of Grant of Invention Patent Right dated Jul. 15, 2025, in connection with Chinese Application No. 202211737635.0, with English translation thereof.
(Continued)

*Primary Examiner* — Feifei Yeung Lopez
(74) *Attorney, Agent, or Firm* — Wolf, Greenfield & Sacks, P.C.

(57) ABSTRACT

A display apparatus includes a first pixel unit located at the center of a display region and at least one second pixel unit located at an edge of the display region. A first light-emitting element in the first pixel and a first light emission adjustment unit corresponding to the first light-emitting element are not shifted from each other. Along a direction in which the first pixel unit points to the second pixel unit, a second light adjustment center of a second light emission adjustment unit in the second pixel unit and a second light-emitting center of a second light-emitting element corresponding to the second light emission adjustment unit are shifted from each other with a shift. The display region includes a shift linear-variation region. In the shift linear-variation region, shifts vary linearly with image heights of pixel units.

17 Claims, 14 Drawing Sheets

(51) Int. Cl.

| | | |
|---|---|---|
| *G02B 3/00* | (2006.01) |
| *G02B 27/01* | (2006.01) |
| *H10K 59/35* | (2023.01) |

(56) References Cited

FOREIGN PATENT DOCUMENTS

| CN | 212873152 U | 4/2021 |
|---|---|---|
| CN | 115084204 A | 9/2022 |
| CN | 116193904 B | 8/2025 |

OTHER PUBLICATIONS

Chinese Notification to Grant Patent Right for Invention dated Jul. 16, 2025, in connection with Chinese Application No. 202211737635. 0, with English Translation thereof.

\* cited by examiner

DISPLAY APPARATUS AND NEAR-EYE DISPLAY DEVICE

CROSS-REFERENCES TO RELATED APPLICATION(S)

This application claims the priority to Chinese Patent Application No. CN202211737635.0, filed on Dec. 30, 2022, the disclosure of which is incorporated herein by reference in its entirety.

TECHNICAL FIELD

The present disclosure relates to the field of display technology and, in particular, to a display apparatus and a near-eye display device.

BACKGROUND

A near-eye display system, such as a virtual reality display system or an augmented reality display system, may be placed on the head of a user and allow the user to observe an image in a display. For example, the near-eye display system may provide the information of an actual scene for an air pilot or an automobile driver and allow the user to observe both the actual scene and the displayed image.

The near-eye display system amplifies an image in a micro-optical display panel through an optical amplifying system (e.g., an optical system) and transmits the image to the human eye.

In the existing near-eye display system, a color cast at a large viewing angle is an urgent problem to be solved.

SUMMARY

The present disclosure provides a display apparatus to alleviate the problem of a color cast of the display apparatus at a large viewing angle.

The present disclosure provides a display apparatus. The display apparatus includes a display region. The display region includes a plurality of pixel units. Each pixel unit among the plurality of pixel units includes a plurality of light-emitting elements and a plurality of light emission adjustment units located on a light emission side of the plurality of light-emitting elements. The plurality of light emission adjustment units are in one-to-one correspondence with the plurality of light-emitting elements.

The plurality of pixel units include a first pixel unit and at least one second pixel unit. The first pixel unit is located at a center of the display region. The at least one second pixel unit is located on a side of the first pixel unit facing an edge of the display region.

For the first pixel unit, light-emitting elements in the first pixel unit are first light-emitting elements, and light emission adjustment units in the first pixel unit are first light emission adjustment units. Each of the first light-emitting elements includes a first light-emitting center, and each of the first light emission adjustment units includes a first light adjustment center. A first light-emitting center of a first light-emitting element among the first light-emitting elements coincides with a first light adjustment center of a respective first light emission adjustment unit, corresponding to the first light-emitting element, among the first light emission adjustment units.

For each second pixel unit, light-emitting elements in each second pixel unit are second light-emitting elements, and light emission adjustment units in the second pixel unit are second light emission adjustment units. Each of the second light-emitting elements includes a second light-emitting center, and each of the second light emission adjustment units includes a second light adjustment center. Along a first direction, a second light adjustment center of a second light emission adjustment unit among the second light emission adjustment units and a second light-emitting center of a respective second light-emitting element, corresponding to the second light emission adjustment unit, among the second light-emitting elements are shifted from each other with a shift. The second light adjustment center of each second light emission adjustment unit is located on a side of the second light-emitting center, facing away from the first light-emitting center, of the respective second light-emitting element.

The first direction is a direction in which the first pixel unit points to a second pixel unit among the at least one second pixel unit.

The display region includes a shift linear-variation region. In the shift linear-variation region, shifts vary linearly with image heights of pixel units among the plurality of pixel units.

In the shift linear-variation region, a shift of an i-th pixel unit which is from a center of the display region along the first direction is that $Shift_i=n*(i*d)$. A relationship between the shift $Shift_i$ of the i-th pixel and a main-optical-axis included angle of the i-th pixel is that $Shift_i=m*CRA_i$. The main-optical-axis included angle of the i-th pixel is that $CRA_i=k*(i*d)$.

i is greater than 0 and less than N. N denotes a number of pixel units along the first direction and among the plurality of pixel units.

d denotes a size of one of the pixel units along the first direction.

n denotes a slope of the shifts varying with the image heights of the pixel units. n is a constant not equal to 0.

k denotes a slope of main-optical-axis included angles varying with the image heights. k is a constant not equal to 0.

m denotes a slope of the shifts varying with the main-optical-axis included angles. m is a constant not equal to 0.

x denotes a size of a light-emitting region along the first direction.

$$k \le x/(2m*N*d),$$

For the display apparatus according to the present disclosure, a virtual image spot formed in the central region is expanded to cover the entire display region so that no obvious boundary of the virtual image spot can be seen in the display region, making the display brightness of the display region more uniform and improving the display effect of the display apparatus.

The present disclosure further provides a near-eye display device. The near-eye display device includes the preceding display apparatus.

It is to be understood that the content described in this part is neither intended to identify key or important features of embodiments of the present disclosure nor intended to limit the scope of the present disclosure. Other features of the present disclosure become easily understood through the description hereinafter.

BRIEF DESCRIPTION OF DRAWINGS

To illustrate technical solutions in embodiments of the present disclosure more clearly, drawings used in description of the embodiments will be briefly described below. Apparently, the drawings described below illustrate part of the embodiments of the present disclosure, and those of ordinary skill in the art may obtain other drawings based on the drawings described below on the premise that no creative work is done.

Figure 1:
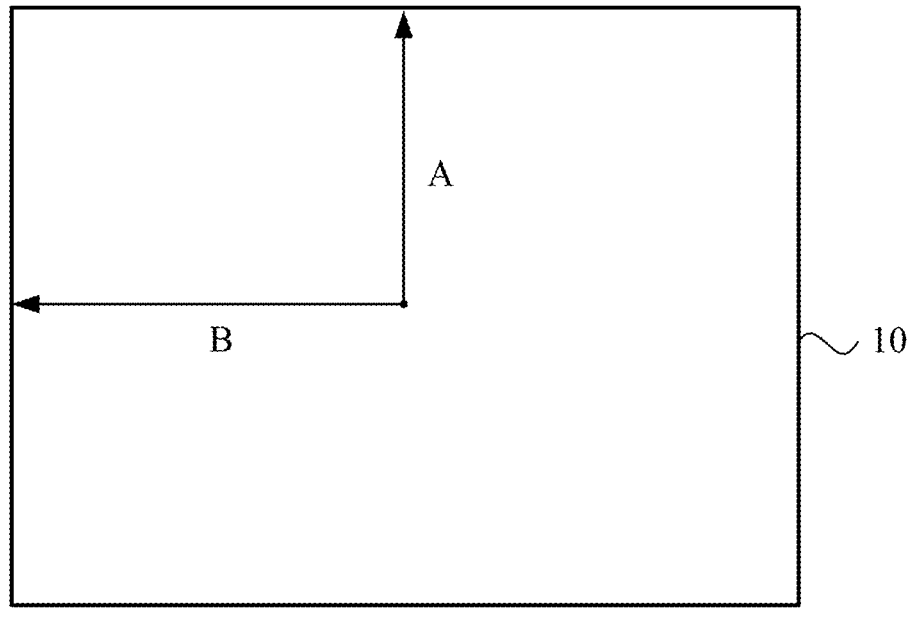

FIG. 1 is a structural diagram of a display apparatus in the related art.

Figure 2:
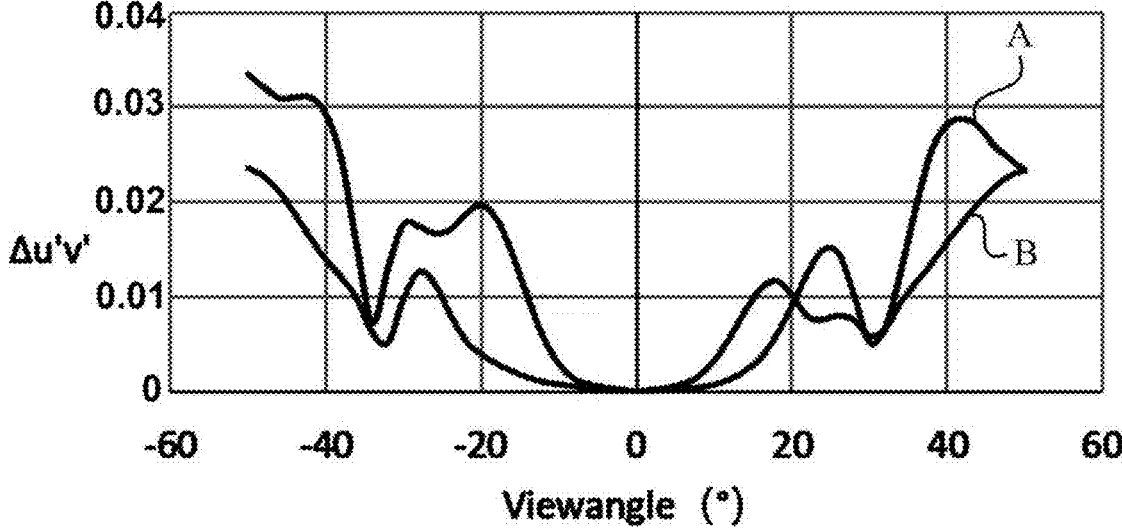

FIG. 2 is a graph illustrating color casts of the display apparatus of FIG. 1 at viewing angles of various directions.

Figures 3, 4:
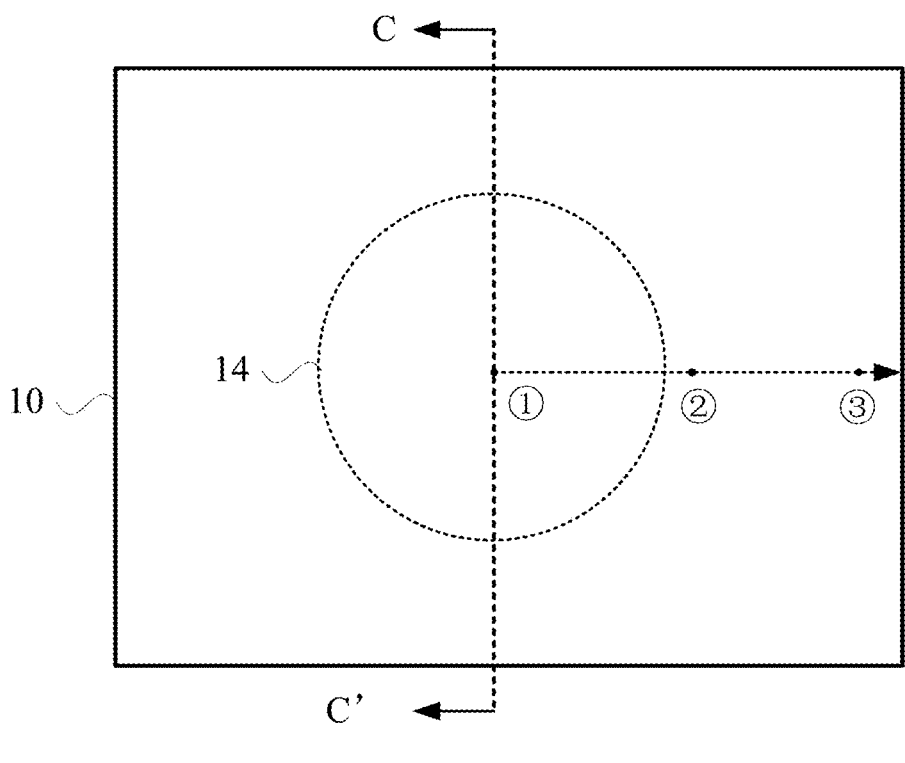

FIG. 3 is a structural diagram of a display apparatus in the related art.

FIG. 4 is a partial sectional view of a pixel unit at point ① of FIG. 3.

Figure 5:
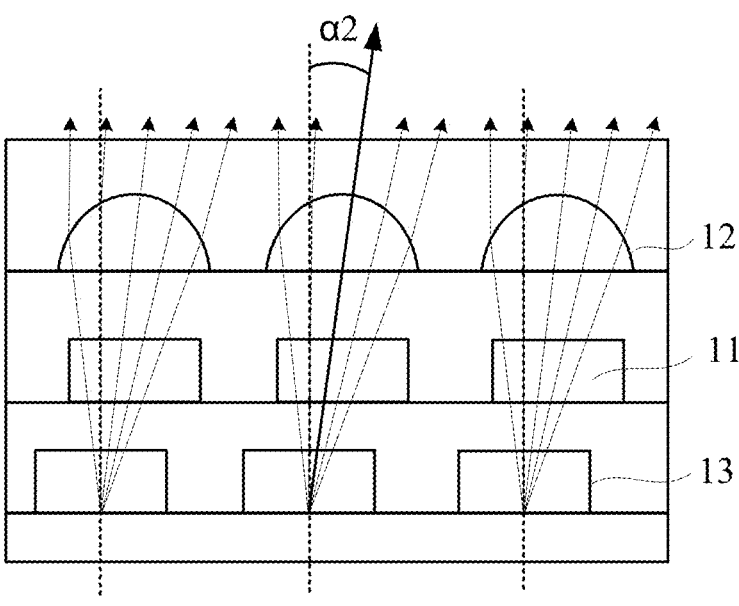

FIG. 5 is a partial sectional view of a pixel unit at point ② of FIG. 3.

Figure 6:
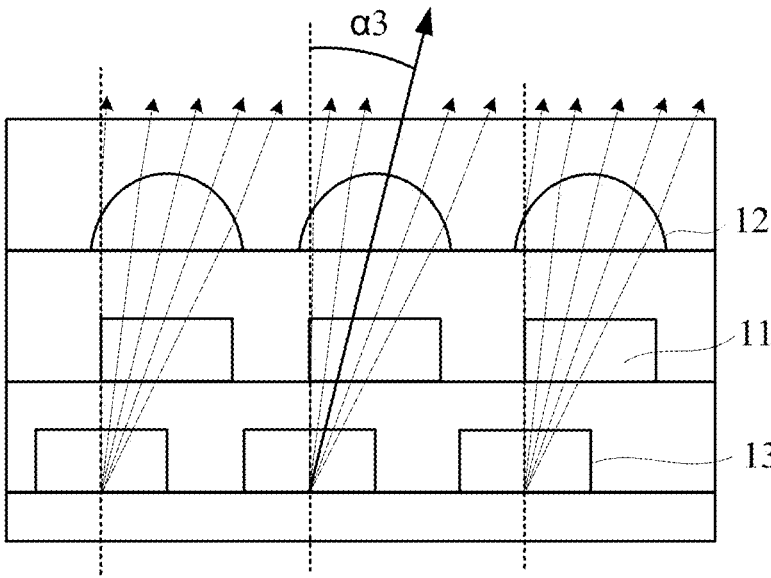

FIG. 6 is a partial sectional view of a pixel unit at point ③ of FIG. 3.

Figure 7:
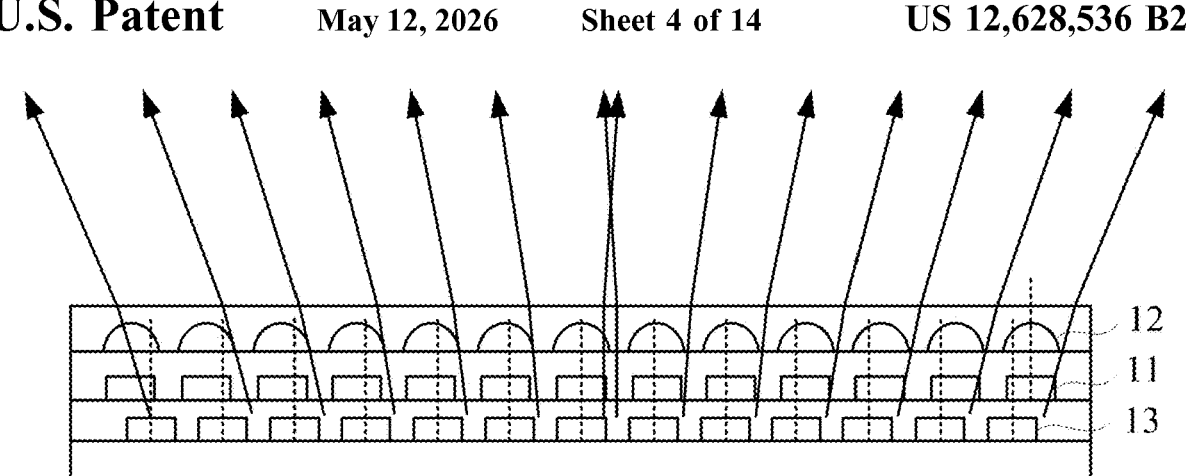

FIG. 7 is a sectional view taken along direction C-C' of FIG. 3.

Figure 8:
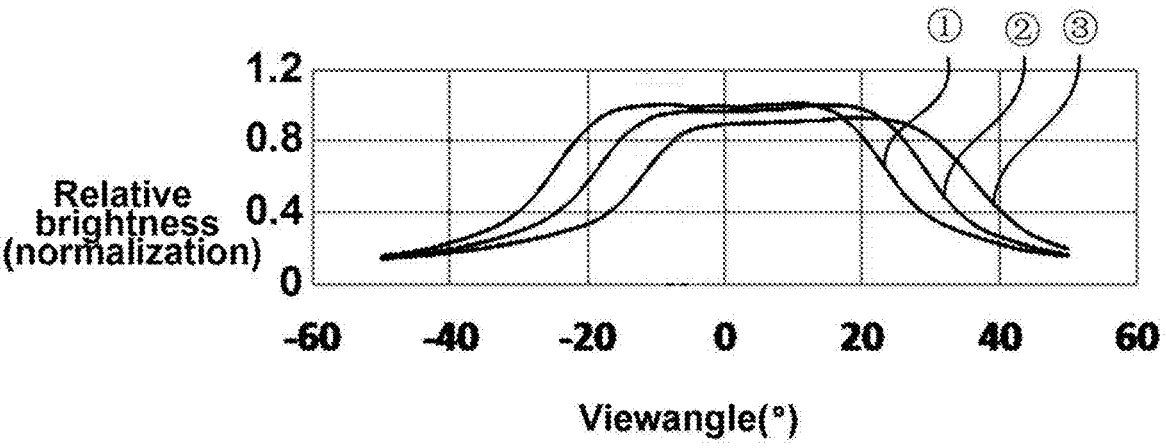

FIG. 8 is a graph illustrating the relative brightness of the display apparatus of FIG. 3 at various viewing angles at different points.

Figure 9:
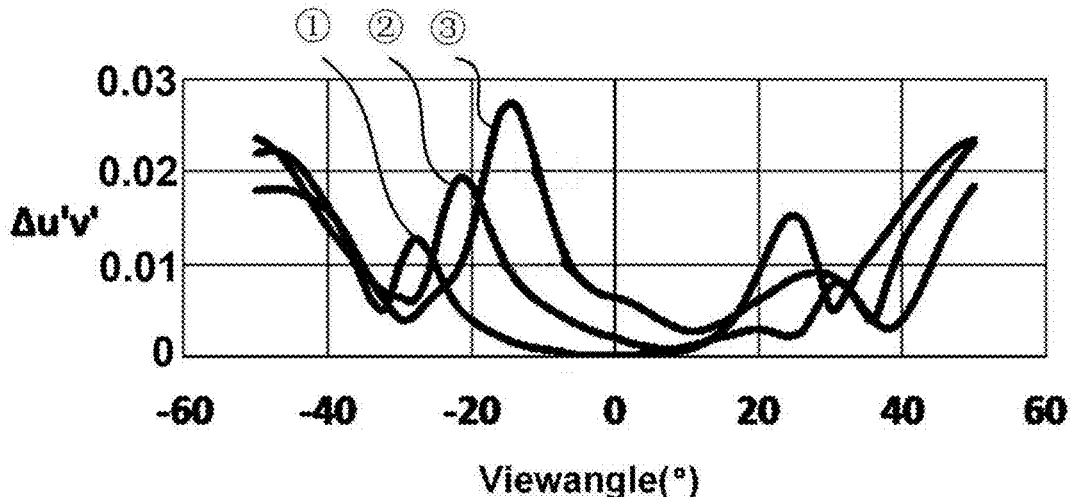

FIG. 9 is a graph illustrating color cast differences of the display apparatus of FIG. 3 at various viewing angles at different points.

Figure 10:
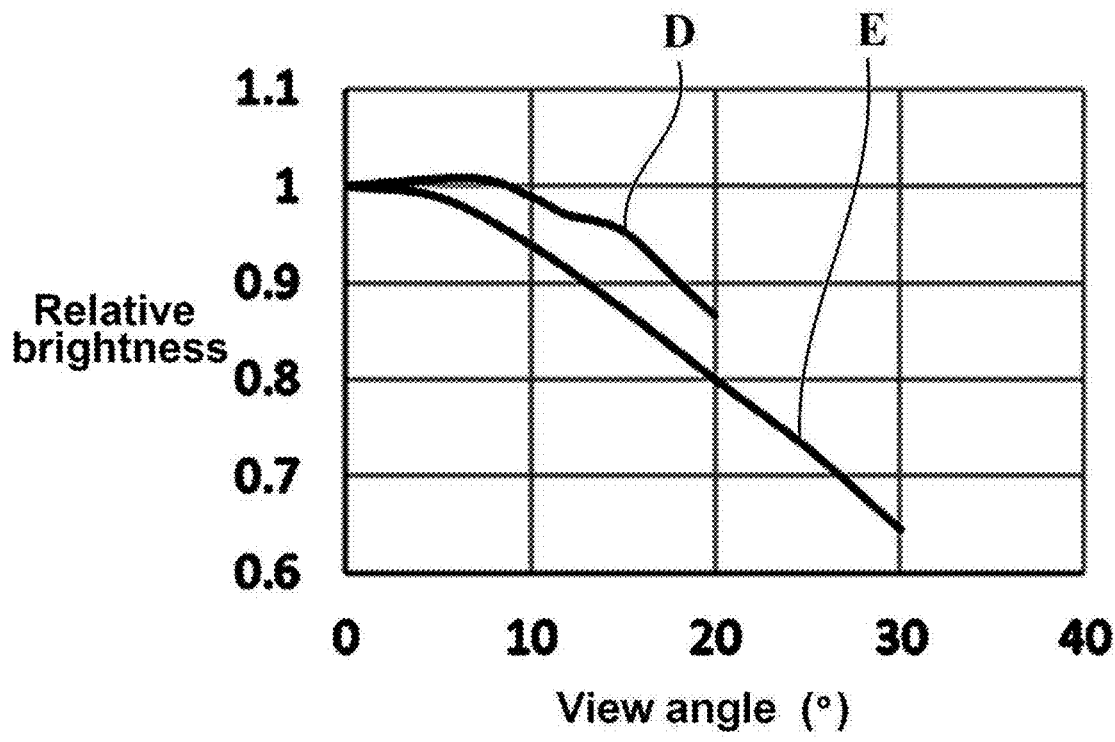

FIG. 10 is a graph illustrating the relative brightness of the display apparatus of FIG. 3 at various viewing angles.

Figure 11:
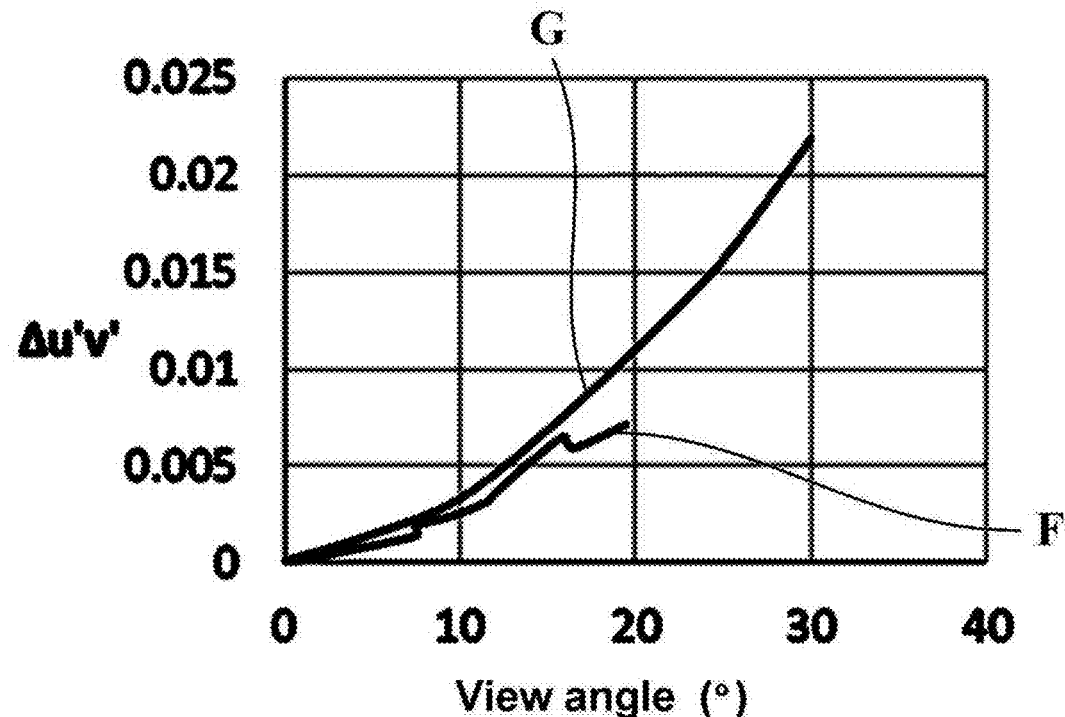

FIG. 11 is a graph illustrating color cast differences of the display apparatus of FIG. 3 at various viewing angles.

Figure 12:
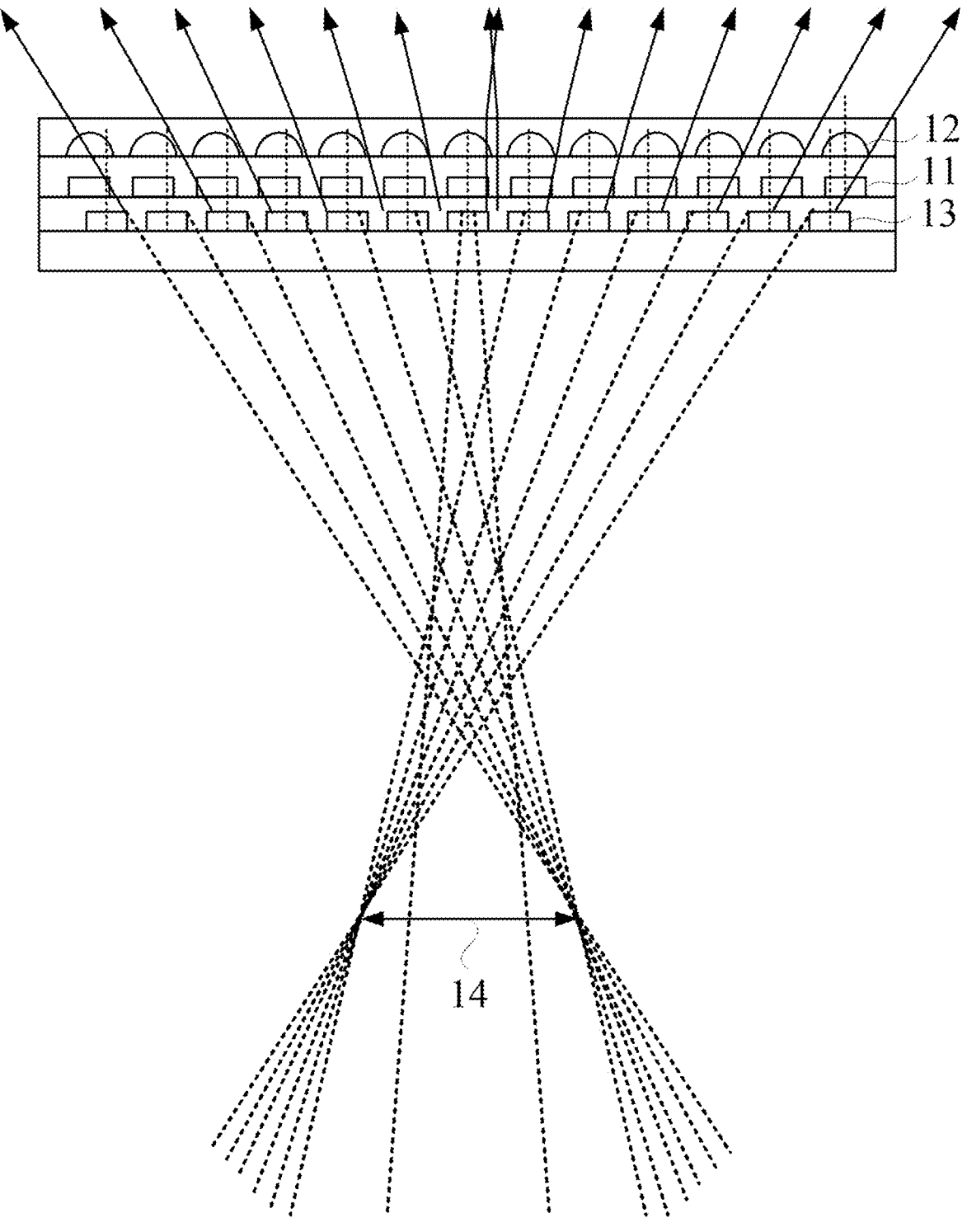

FIG. 12 is an optical path diagram of the display apparatus of FIG. 3.

Figure 13:
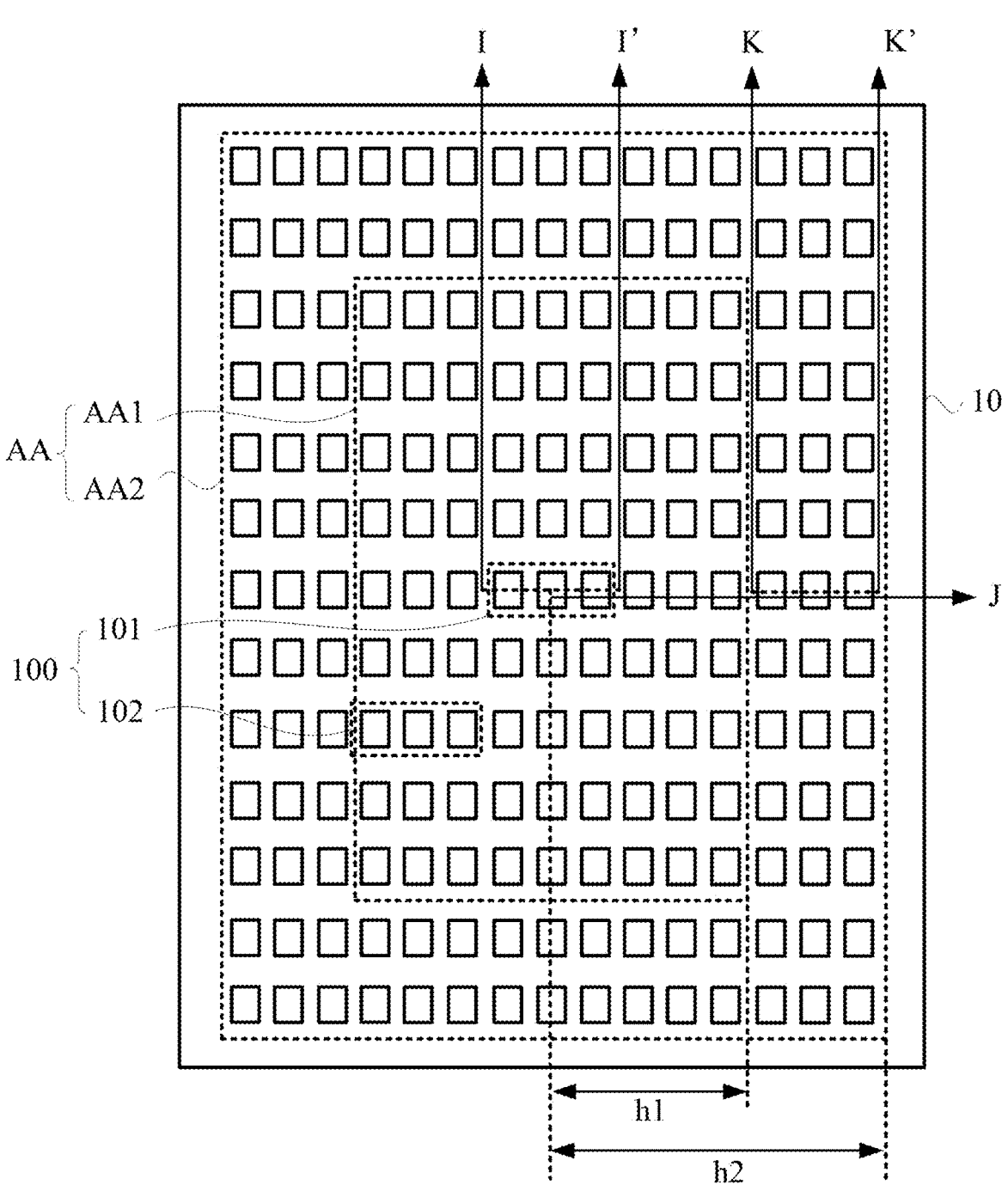

FIG. 13 is a structural diagram of a display apparatus according to an embodiment of the present disclosure.

Figure 14:
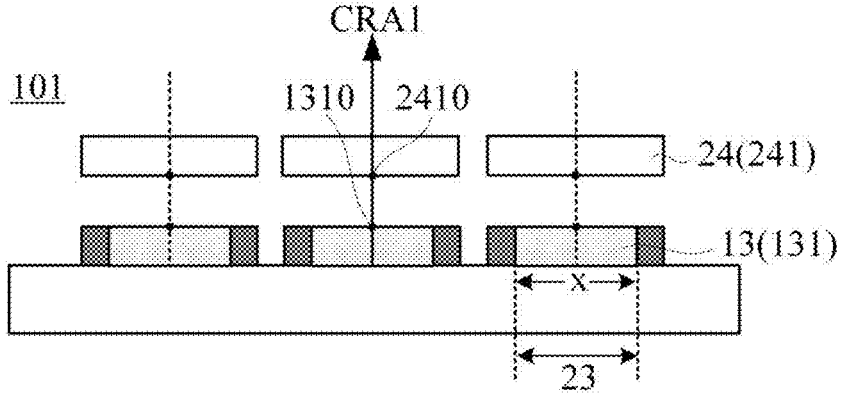

FIG. 14 is a sectional view taken along direction I-I' of FIG. 13.

Figure 15:
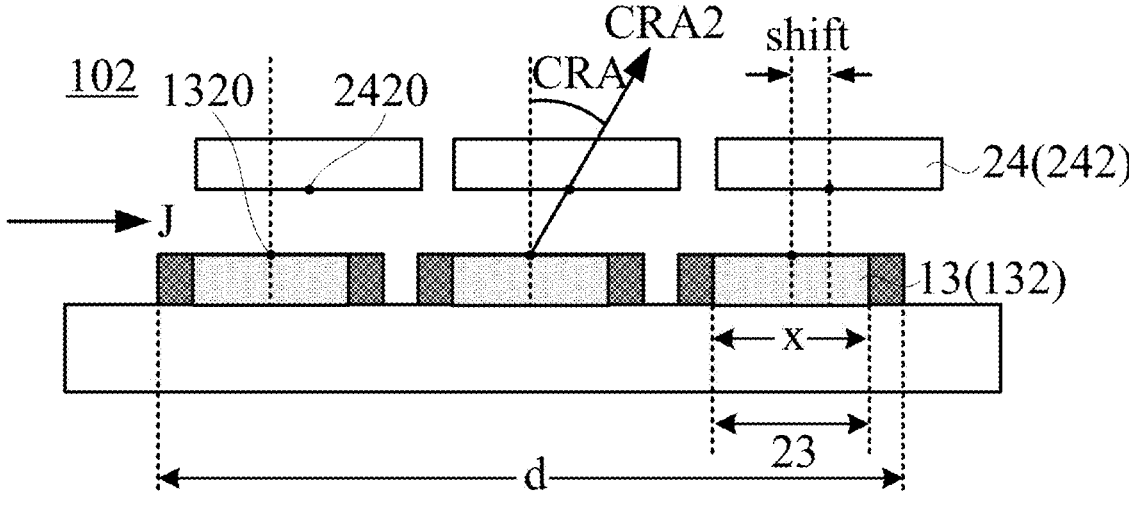

FIG. 15 is a sectional view taken along direction K-K' of FIG. 13.

Figure 16:
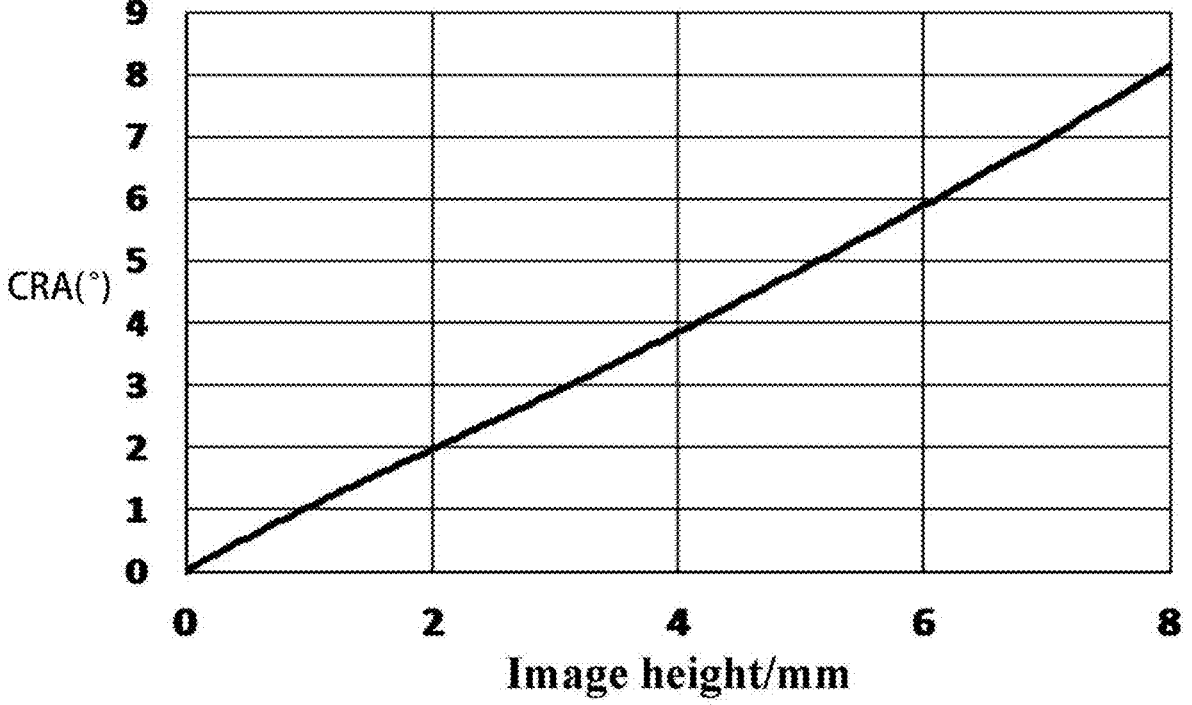

FIG. 16 is a diagram illustrating a correspondence relationship between main-optical-axis included angles and image heights in a shift linear-variation region of a display apparatus according to an embodiment of the present disclosure.

Figure 17:
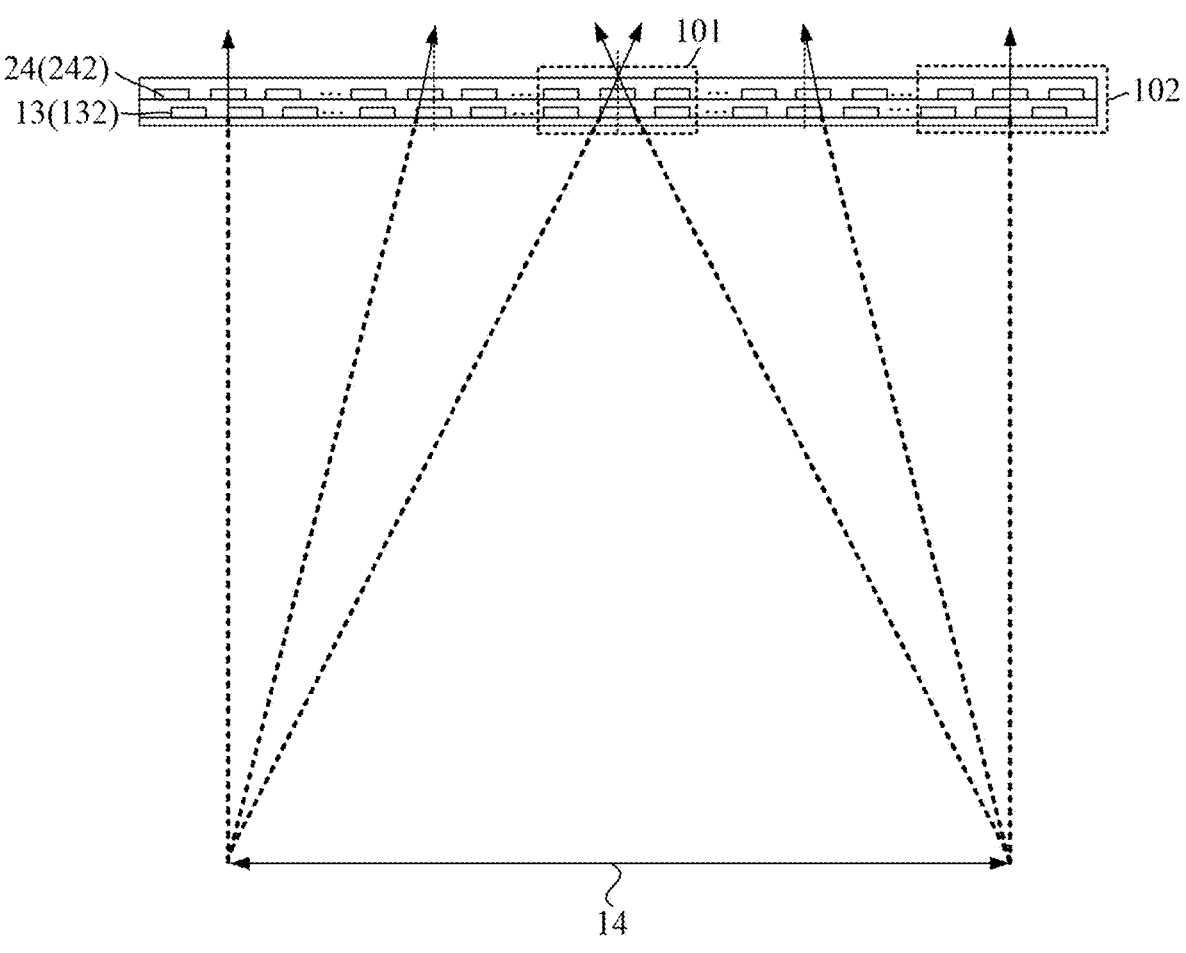

FIG. 17 is an optical path diagram of a display apparatus according to an embodiment of the present disclosure.

Figure 18:
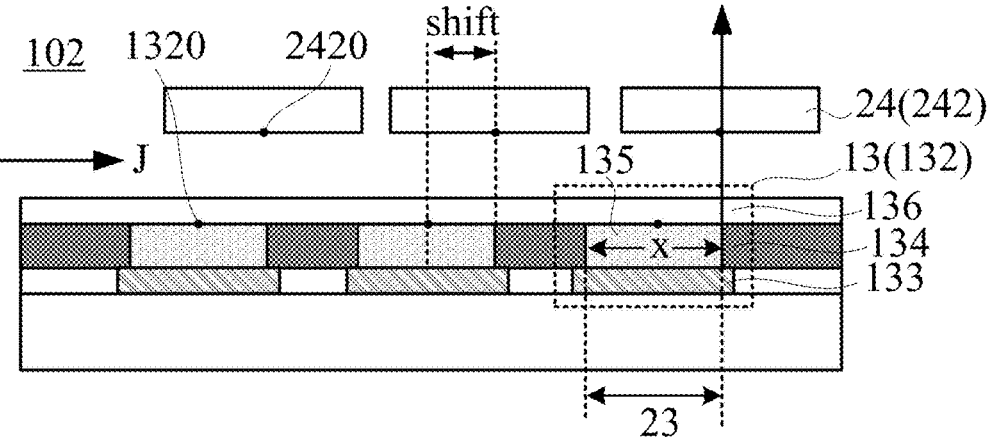

FIG. 18 is a partial sectional view of a display apparatus according to an embodiment of the present disclosure.

Figure 19:
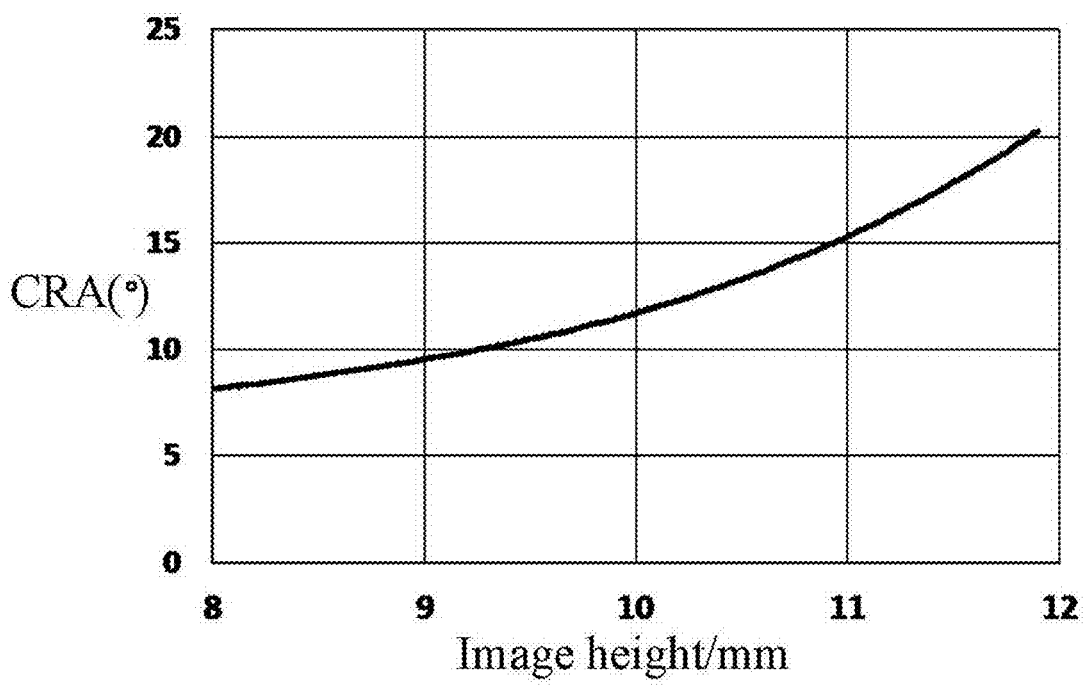

FIG. 19 is a diagram illustrating a correspondence relationship between main-optical-axis included angles and image heights in a shift non-linear-variation region of a display apparatus according to an embodiment of the present disclosure.

Figure 20:
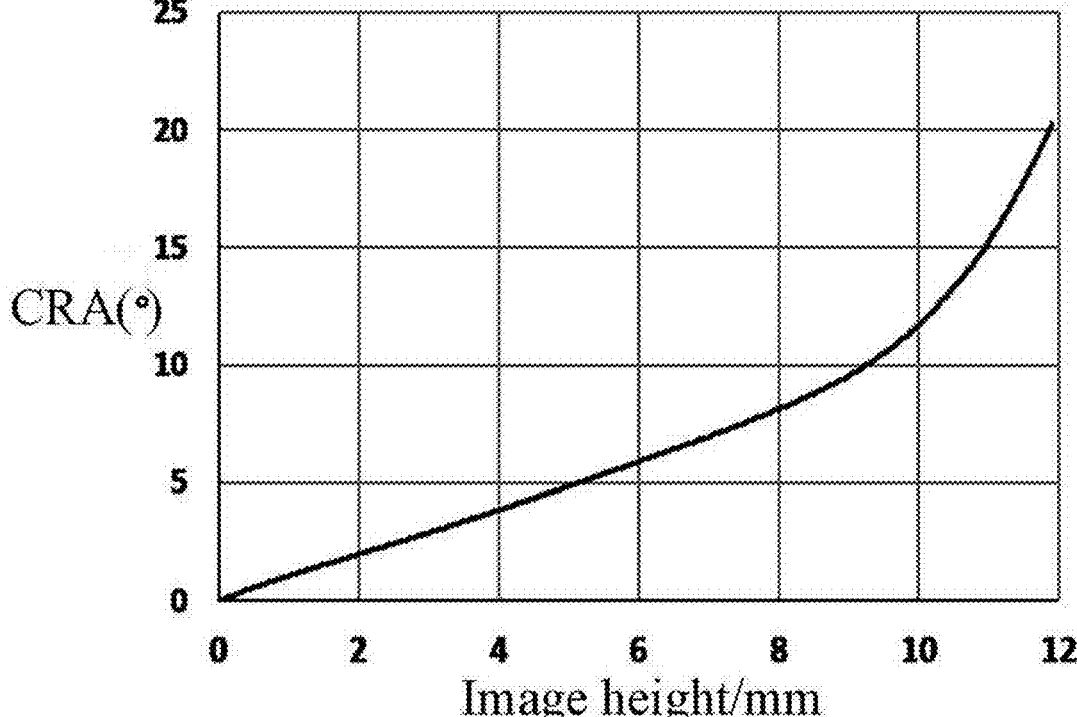

FIG. 20 is a diagram illustrating a correspondence relationship between main-optical-axis included angles and image heights of a display apparatus according to an embodiment of the present disclosure.

Figure 21:
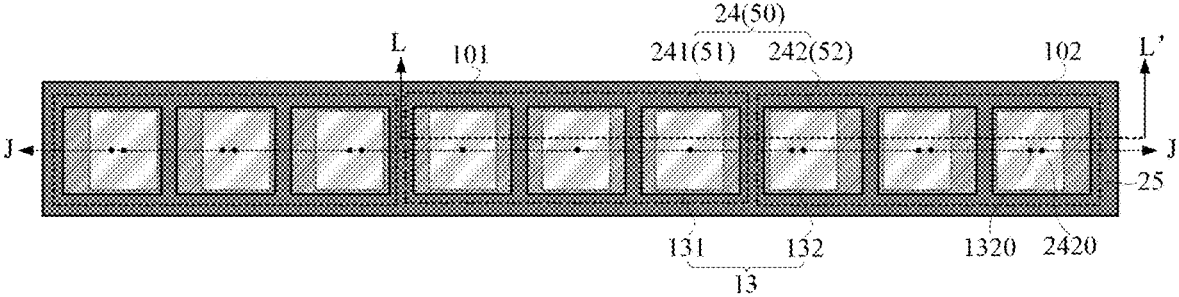

FIG. 21 is a partial structural diagram of a display apparatus according to an embodiment of the present disclosure.

Figure 22:
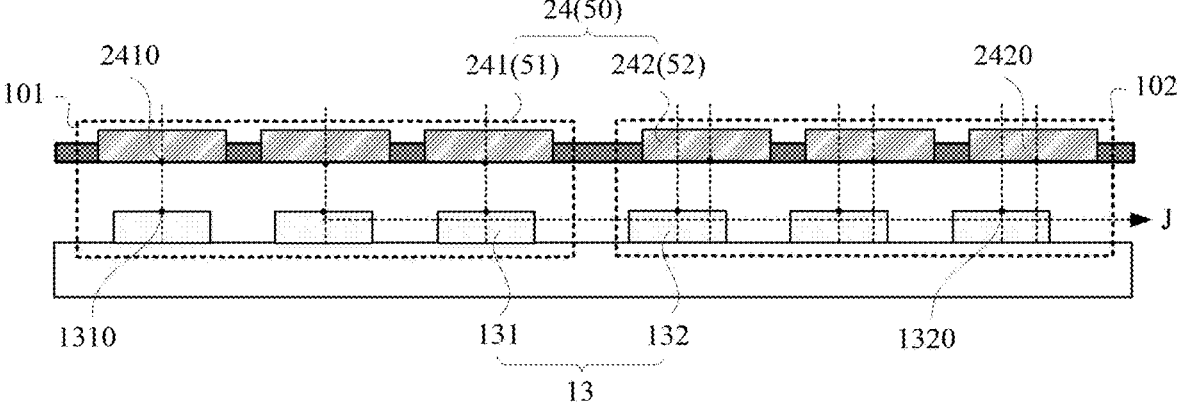

FIG. 22 is a sectional view taken along direction L-L' of FIG. 21.

Figure 23:
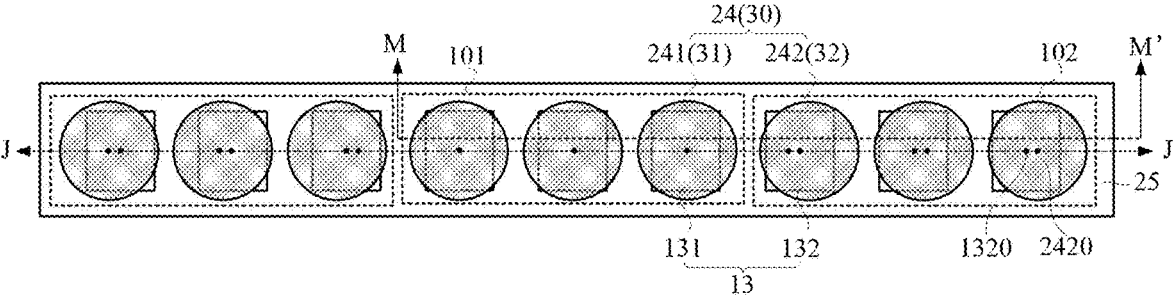

FIG. 23 is a partial structural diagram of another display apparatus according to an embodiment of the present disclosure.

Figure 24:
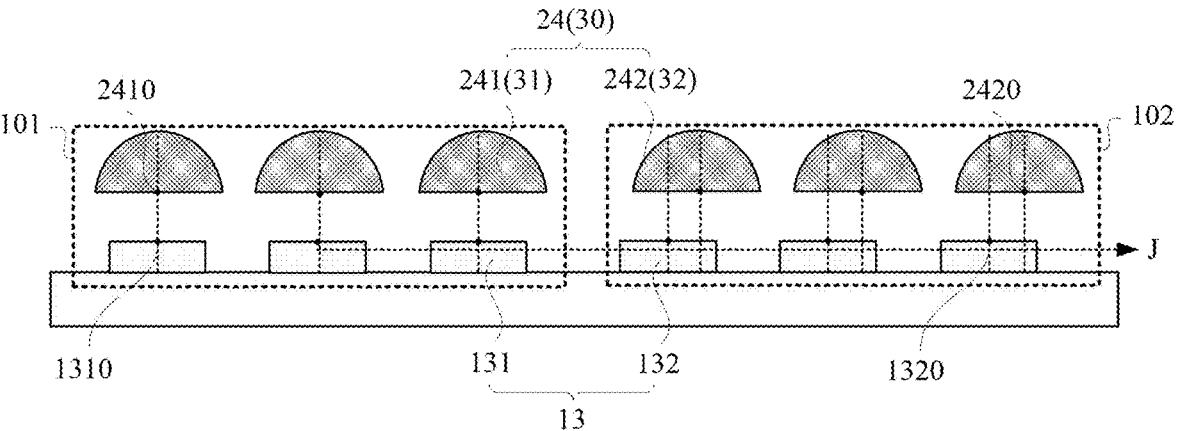

FIG. 24 is a sectional view taken along direction M-M' of FIG. 23.

4

Figure 25:
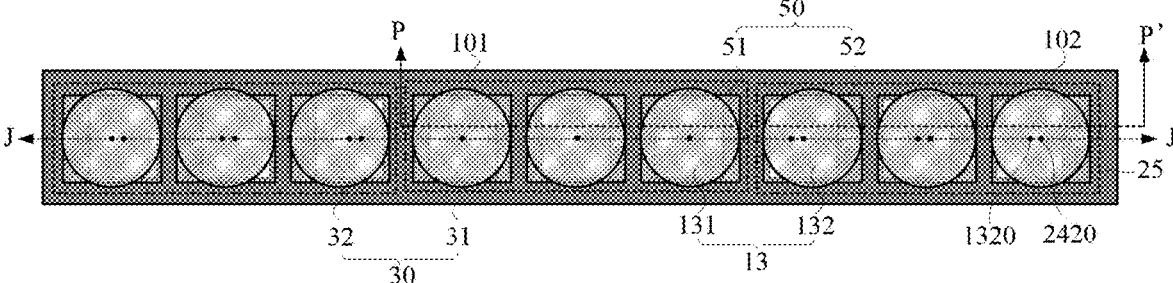

FIG. 25 is a partial structural diagram of another display apparatus according to an embodiment of the present disclosure.

Figure 26:
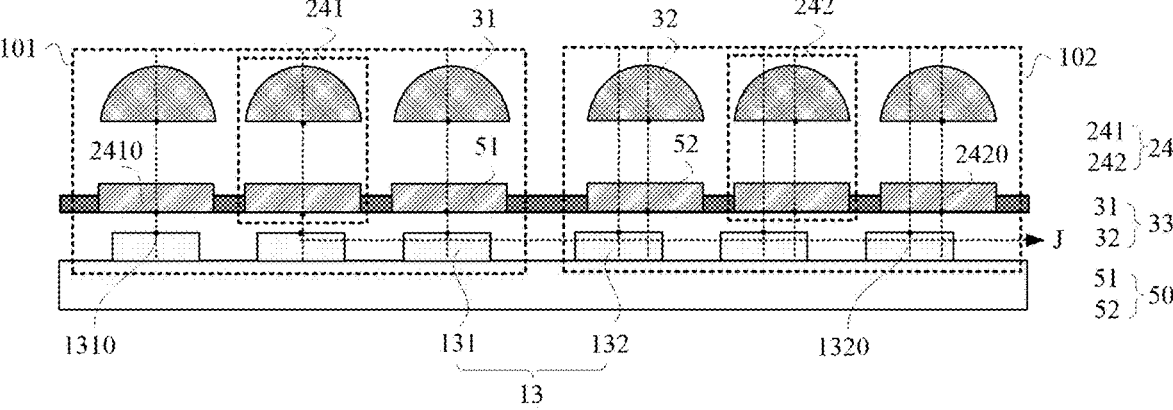

FIG. 26 is a sectional view taken along direction P-P' of FIG. 25.

Figure 27:
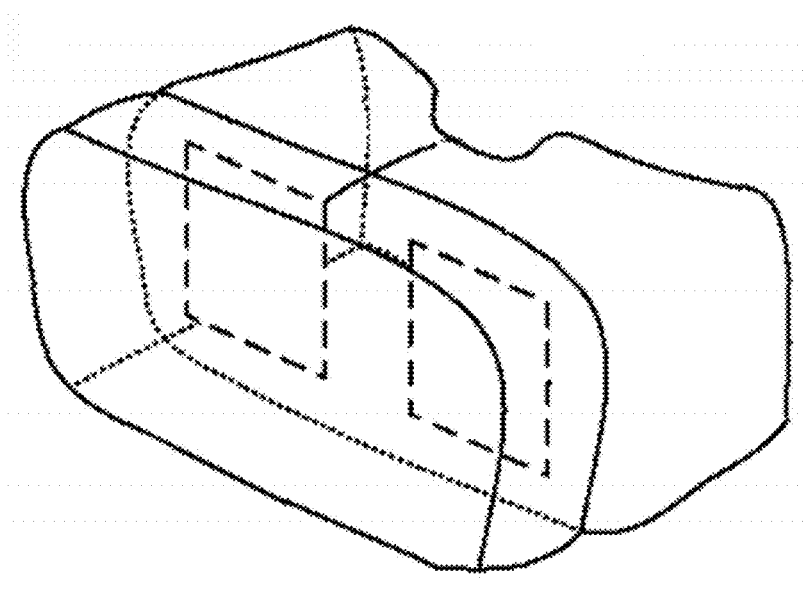

FIG. 27 is a diagram of a near-eye display device according to an embodiment of the present disclosure.

DETAILED DESCRIPTION

Technical solutions in embodiments of the present disclosure are described clearly and completely in conjunction with drawings in embodiments of the present disclosure from which solutions of the present disclosure are better understood by those skilled in the art. Apparently, the embodiments described below are part, not all, of embodiments of the present disclosure. Based on embodiments of the present disclosure, all other embodiments obtained by those of ordinary skill in the art on the premise that no creative work is done are within the scope of the present disclosure.

It is to be noted that the terms "first", "second", and the like in the description, claims, and drawings of the present disclosure are used for distinguishing between similar objects and are not necessarily used for describing a particular order or sequence. It should be understood that the data used in this manner is interchangeable in appropriate cases so that embodiments of the present disclosure described here can be implemented in an order not illustrated or described here. In addition, the terms "including", "having", and variations thereof are intended to encompass a non-exclusive inclusion. For example, a process, method, system, product, or device that includes a series of steps or elements not only includes the expressly listed steps or elements but may also include other steps or elements that are not expressly listed or are inherent to such a process, method, product, or device.

FIG. 1 is a structural diagram of a display apparatus in the related art. FIG. 2 is a graph illustrating color casts of the display apparatus of FIG. 1 at viewing angles of various directions. As shown in FIGS. 1 and 2, in the near-eye display technology, an optical system needs to receive the light in different cone angle ranges at different points of a screen of the display apparatus so as to obtain a relatively large field of view (FOV). Chief ray angles (CRAs) of light-receiving cone angles vary with image heights. A required light-receiving CRA at an edge of the screen generally exceeds 20 degrees.

FIG. 2 illustrates a variation trend of color cast differences $\Delta u'v'$ against viewing angles Viewangle in a vertical orientation A and a horizontal orientation B for the display apparatus 10 of FIG. 1. As shown in FIG. 2, an inventor finds through research that a color cast difference of the existing display apparatus 10 at a viewing angle greater than 20° is relatively large due to the microcavity effect of the OLED display apparatus and the four-corner light crosstalk effect of color filter. Accordingly, when the display apparatus 10 is applied to a near-eye display apparatus, for example, a virtual reality (VR) product, an augmented reality (AR) product, or an electronic view finder (EVF), the problem of a color cast inside an image is generated.

FIG. 3 is a structural diagram of a display apparatus in the related art. FIG. 4 is a partial sectional view of a pixel unit at point ① of FIG. 3. FIG. 5 is a partial sectional view of a pixel unit at point ② of FIG. 3. FIG. 6 is a partial sectional view of a pixel unit at point ③ of FIG. 3. FIG. 7 is a sectional view taken along a direction C-C' of FIG. 3. FIG.

8 is a graph illustrating the relative brightness of the display apparatus of FIG. 3 at various viewing angles at different points. FIG. 9 is a graph illustrating color cast differences of the display apparatus of FIG. 3 at various viewing angles at different points. FIG. 10 is a graph illustrating the relative brightness of the display apparatus of FIG. 3 at various viewing angles. FIG. 11 is a graph illustrating color cast differences of the display apparatus of FIG. 3 at various viewing angles. As shown in FIGS. 3 to 11, the inventor further finds through research that color filters 11 in the display apparatus 10 and microlenses 12 in the display apparatus 10 can be shifted at positions with different image heights relative to light-emitting elements 13 to alleviate a color cast at a screen viewing angle.

In an embodiment, as shown in FIGS. 3 to 7, at point ①, an image height is 0 mm, a color filter 11 and a microlens 12 are not shifted relative to a light-emitting element 13, and the emission angle α1 of the main light of a pixel unit at this point is 0°. At point ②, an image height is x1 mm, a color filter 11 and a microlens 12 are slightly shifted relative to a light-emitting element 13, and the emission angle α2 of the main light of a pixel unit at this point is greater than 0°. At point ③, an image height is x2 mm, and x2 is greater than x1; a color filter 11 and a microlens 12 are greatly shifted relative to a light-emitting element 13; and the emission angle α3 of the main light of a pixel unit at this point is greater than the emission angle α2 of the main light of the pixel unit at point ②. That is, as the image heights increase, shifts of the color filters 11 and microlenses 12 relative to the light-emitting elements 13 may increase gradually so that emission angles of the main light of pixel units at various points tend to be consistent with the light-receiving CRAs of the optical system, thereby increasing the relative brightness of various points at the viewing angles of the light-receiving CRAs of the optical system, reducing the color cast differences of various points at the viewing angles of the light-receiving CRAs of the optical system, and thereby alleviating a color cast at a screen viewing angle.

FIG. 8 illustrates the relative brightness of the display apparatus 10 of FIG. 3 at various viewing angles Viewangle at different points (point ①, point ②, and point ③). The brightness at a viewing angle of 0° is normalized to 1. In this case, the relative brightness may be understood as relative values of the brightness at various viewing angles relative to the brightness at the viewing angle of 0°. FIG. 9 illustrates the color cast differences Δu'v' of the display apparatus 10 of FIG. 3 at various viewing angles Viewangle at different points (point ①, point ②, and point ③). As shown in FIGS. 8 and 9, color cast difference curves at various viewing angles and relative brightness curves at various viewing angles vary with points, showing a trend of shifts gradually changing with points. For each point, the arrangement in which a color filter 11 at the point and a microlens 12 at the point are shifted by a corresponding distance relative to a light-emitting element 13 at the point increases the relative brightness at the point at a viewing angle of a light-receiving CRA of the optical system, reduces a color filter difference at the point at the viewing angle of the light-receiving CRA of the optical system, and alleviates a color cast at a screen viewing angle.

FIG. 10 illustrates a relative brightness curve D of the display apparatus 10 of FIGS. 3 to 7 at various viewing angles and a relative brightness curve E of the display apparatus 10 of FIG. 1 at various viewing angles. FIG. 11 illustrates a color cast difference curve F of the display apparatus 10 of FIGS. 3 to 7 at various viewing angles and a color cast difference curve G of the display apparatus 10 of FIG. 1 at various viewing angles. The color filters 11 and microlenses 12 in the display apparatus 10 of FIGS. 3 to 7 are shifted at positions with different image heights relative to the light-emitting elements 13, while the color filters and microlenses in the display apparatus 10 of FIG. 1 are not shifted at positions with different image heights relative to the light-emitting elements. As shown in FIGS. 10 and 12, the arrangement in which the color filters 11 and the microlenses 12 are shifted relative to the light-emitting elements 13 by a certain distance increases the relative brightness of the display apparatus 10 at various viewing angles Viewangle, reduces the color cast differences Δu'v' of the display apparatus 10 at various viewing angles Viewangle, and thereby alleviates a color cast at a screen viewing angle. Moreover, the more the viewing angles, the greater the alleviation.

However, the inventor further finds through research that when the size of a light-emitting element 13 is small, or when the color filters 11 and the microlenses 12 are shifted relative to the light-emitting elements 13 by an excessively large distance, the display apparatus shown in FIG. 3 has the problem of a virtual image spot on the screen.

In an embodiment, FIG. 12 is an optical path diagram of the display apparatus of FIG. 3. When the size of a light-emitting element 13 is small, or when the color filters 11 and the microlenses 12 are shifted relative to the light-emitting elements 13 by an excessively large distance, as shown in FIG. 12, the virtual image spot 14 may be generated through reverse extension lines of emission angles of the main light at various points. As shown in FIG. 3, when the display apparatus 10 is watched, the relatively bright virtual image spot 14 may be observed at the center of the display apparatus 10, thereby affecting the display effect of the display apparatus 10.

FIG. 13 is a structural diagram of a display apparatus according to an embodiment of the present disclosure. FIG. 14 is a sectional view taken along a direction I-I' of FIG. 13. FIG. 15 is a sectional view taken along a direction K-K' of FIG. 13.

As shown in FIGS. 13 to 15, the display apparatus according to this embodiment of the present disclosure includes a display region AA. The display region AA includes a plurality of pixel units 100. Each pixel unit 100 includes a plurality of light-emitting elements 13 and a plurality of light emission adjustment units 24 located on a light emission side of the light-emitting elements 13. The light emission adjustment units 24 are in one-to-one correspondence with the light-emitting elements 13. The light emission adjustment units 24 are configured to adjust light emission directions of the light emitted by the light-emitting elements 13 so as to increase the relative brightness of the pixel units 100 at a large viewing angle and reduce a color cast difference at the large viewing angle, thereby alleviating a color cast at a screen viewing angle.

The pixel units 100 include a first pixel unit 101 and a second pixel unit 102. The first pixel unit 101 is located at the center of the display region AA. The second pixel unit 102 is located on a side of the first pixel unit 101 facing an edge of the display region AA.

The first pixel unit 101 includes a plurality of first light-emitting elements 131 and a plurality of first light emission adjustment units 241. The first light-emitting elements 131 are in one-to-one correspondence with the first light emission adjustment units 241. The light emitted by a first light-emitting element 131 is emitted through a first light emission adjustment unit 241 corresponding to the first light-emitting element 131.

The first light-emitting element 131 has a first light-emitting center 1310. The first light emission adjustment unit 241 has a first light adjustment center 2410. The first light-emitting center 1310 of the first light-emitting element 131 coincides with the first light adjustment center 2410 of the first light emission adjustment unit 241 corresponding to the first light-emitting element 131. That is, the first light adjustment center 2410 is not shifted relative to the first light-emitting element 131.

It is to be noted that the coincidence of the first light-emitting center 1310 of the preceding first light-emitting element 131 with the first light adjustment center 2410 of the first light emission adjustment unit 241 refers to that a vertical projection of the center of the first light-emitting element 131 on a plane where the display apparatus is located coincides with a vertical projection of the center of the first light emission adjustment unit 241 on the plane where the display apparatus is located.

With continued reference to FIGS. 13 and 15, the second pixel unit 102 includes a plurality of second light-emitting elements 132 and a plurality of second light emission adjustment units 242. The second light-emitting elements 132 are in one-to-one correspondence with the second light emission adjustment units 242. The light emitted by a second light-emitting element 132 is emitted through a second light emission adjustment unit 242 corresponding to the second light-emitting element 132.

Light-emitting elements 13 in the second pixel unit 102 are the second light-emitting elements 132. Light emission adjustment units 24 in the second pixel unit 102 are the second light emission adjustment units 242. The second light-emitting element 132 has a second light-emitting center 1320. The second light emission adjustment unit 242 has a second light adjustment center 2420. Along a first direction J, that is, along a direction in which the first pixel unit 101 points to the second pixel unit 102, the second light adjustment center 2420 of the second light emission adjustment unit 242 and the second light-emitting center 1320 of the second light-emitting element 132 corresponding to the second light emission adjustment unit 242 are shifted from each other. That is, the second light adjustment center 2420 of the second light emission adjustment unit 242 is shifted relative to the second light-emitting center 1320 with a shift. The second light adjustment center 2420 is located on a side of the second light-emitting center 1320 facing away from the first light-emitting center 1310. With this arrangement, the second light emission adjustment unit 242 is shifted toward a side away from the center of the display region AA so that the main optical axis of a beam emitted through the second light emission adjustment unit 242 is inclined along the direction of the large viewing angle. That is, the emission angle of the main light of the second pixel unit 102 is inclined along the direction of the large viewing angle so that the emission angle of the main light of the second pixel unit 102 matches a light-receiving feature of an optical system, guaranteeing that the optical system can receive more light at the large viewing angle, thereby increasing the relative brightness of the display apparatus 10 at the large viewing angle, reducing a color cast difference at the large viewing angle, and alleviating a color cast at a screen viewing angle.

Referring to FIG. 13, the display region includes a shift linear-variation region AA1. In the shift linear-variation region AA1, shifts vary linearly with image heights of pixel units along the first direction J.

As shown in FIGS. 13 to 15, the display region AA of the display apparatus 10 is provided with a plurality of pixel units 100. A pixel unit 100 refers to a repeatable unit in a pixel structure. Several pixel units 100 are arranged sequentially. In an embodiment, several pixel units 100 may be arranged sequentially to form a matrix.

Each pixel unit 100 includes a plurality of light-emitting elements 13 configured to emit visible light to implement image display.

A pixel unit 100 may include two light-emitting elements 13 or may include three, four, five, or more light-emitting elements 13. Light-emitting elements 13 in a pixel unit 100 have different light-emitting colors so as to implement color display or color optimization display.

Exemplarily, for one pixel unit 100, the pixel unit 100 may typically include a red light-emitting element, a green light-emitting element, and a blue light-emitting element. For pixel units 100 of some types, a pixel unit 100 may also include, but is not limited to, a white light-emitting element.

It is to be noted that a light-emitting element 13 may be, for example, an organic light-emitting diode or an inorganic light-emitting diode, which is not specifically limited in embodiments of the present disclosure.

As shown in FIGS. 13 to 15, each pixel unit includes a plurality of sub-pixel units. A sub-pixel unit includes one light-emitting element 13 and one light emission adjustment unit 24 located on a light emission side of the light-emitting element 13. Light emission adjustment units 24 are in one-to-one correspondence with light-emitting elements 13. Multiple sub-pixel units of the same pixel unit have the same shift.

Additionally, the shape of a light-emitting element 13 in a pixel unit 100 may be designed according to different pixel arrangements. For example, the light-emitting element 13 may be hexagonal, circular, or elliptical. FIGS. 13 and 14 merely illustrate an example in which the light-emitting element 13 is rectangular, which is not limited here.

With continued reference to FIGS. 13 to 15, the first pixel unit 101 corresponds to a first main optical axis CRA1. A second pixel unit 102 corresponds to a second main optical axis CRA2. The first main optical axis CRA1 may be understood as the central main optical axis of the display apparatus. The direction of the first main optical axis CRA1 is perpendicular to the display apparatus 10. The second main optical axis CRA2 may be understood as an edge main optical axis of a display panel. The second main optical axis CRA2 is inclined toward the edge of the display region AA. The second main optical axis CRA1 of the second pixel unit 102 and the first main optical axis CRA1 of the first pixel unit 101 have an angle CRA.

Referring to FIG. 16, FIG. 16 is a diagram illustrating a correspondence relationship between main-optical-axis angles CRA and image heights in a shift linear-variation region of a display apparatus according to an embodiment of the present disclosure. As shown in FIG. 16, in the shift linear-variation region AA1, the second main optical axis CRA2 of the second pixel unit 102 serving as the i-th pixel unit and the first main optical axis CRA1 of the first pixel unit 101 have an angle $CRA_i$. The distance between the second pixel unit 102 and the center of the display region AA, that is, the image height of the second pixel unit 102, is i*d. A relationship of the second main optical axis CRA2 of the second pixel unit 102 serving as the i-th pixel unit varying with the image height satisfies that $CRA_i=k*(i*d)$.

k is a proportionality coefficient and denotes a slope of the main-optical-axis angles CRA varying with the image heights. k is a constant not equal to 0. The inventor finds through research that the smaller the slope k, the larger the formed virtual image spot.

FIG. 16 is a diagram illustrating the correspondence relationship between the main-optical-axis angles CRA and the image heights. Positions with different image heights have different main-optical-axis angles CRA, thereby determining light emission properties at the positions with the image heights. The main-optical-axis angles CRA are controlled through the shifts. The main-optical-axis angle CRA of a pixel unit may be determined by setting a shift between the light adjustment center of a light emission adjustment unit of the pixel unit and the light-emitting center of a light-emitting element corresponding to the light emission adjustment unit.

A relationship between the shift $Shift_i$ of the i-th pixel unit and the main-optical-axis angle $CRA_i$ of the i-th pixel unit is that $Shift_i = m*CRA_i$. That is, the shift $Shift_i$ of the i-th pixel unit is proportional to the main-optical-axis angle $CRA_i$ of the i-th pixel unit, and the proportional factor of them is m. m denotes a slope of the shifts varying with the main-optical-axis angles. m is a constant not equal to 0. m is an optical constant determined according to values such as materials, thicknesses and refractive indices of layers from the light-emitting element to a light emission surface. In a determined display apparatus, m is a fixed value.

The relationship of the main-optical-axis angle of the i-th pixel unit varying with the image height satisfies that $CRA_i = k*(i*d)$. The relationship between the shift $Shift_i$ of the i-th pixel unit and the main-optical-axis angle $CRA_i$ of the i-th pixel unit is that $Shift_i = m*CRA_i$. The shift corresponding to the second pixel unit 102 serving as the i-th pixel unit is that $Shift_i = n*(i*d)$. Accordingly, it is known that $Shift_i = n*(i*d) = m*CRA_i = m*k*(i*d)$. $n = k*m$. In a determined display apparatus, m is a fixed value. In this case, in a determined display apparatus, a slope of the shifts varying with the image heights of the pixel units is related to k.

In an embodiment, FIG. 17 is an optical path diagram of a display apparatus according to an embodiment of the present disclosure. As shown in FIG. 17, in a second pixel unit 102 at the edge of the display region AA, a boundary position of the virtual image spot 14 is determined by the reverse extension line of the light emitted through a second light emission adjustment unit 242 at an edge on a side of a second light-emitting element 132 facing away from the center of the display region AA.

It can be seen that the smaller the k, the smaller the $CRA_i$ and the smaller the corresponding $Shift_i$. As shown in FIG. 17, a smaller $Shift_i$ indicates that the reverse extension line of the light emitted through a second light emission adjustment unit 242 at the edge on a side of the second light-emitting element 132 of the i-th second pixel unit 102 facing away from the center of the display region AA deviates further away from the center of the display region AA. Accordingly, the boundary position of the virtual image spot 14 is made to move toward a direction away from the center of the display region AA, thereby forming a larger virtual image spot 14.

With continued reference to FIGS. 14 and 15, the second light-emitting element 132 includes a light-emitting region 23 where visible light is emitted.

FIG. 19 is a partial sectional view of a display apparatus according to an embodiment of the present disclosure. As shown in FIG. 19, the light-emitting element 13 is an organic light-emitting diode (OLED). The light-emitting element 13 includes an anode 133, a pixel defining layer 134, an organic light-emitting layer 135, and a cathode 136. An opening is disposed on the pixel defining layer 134. The organic light-emitting layer 135 is disposed in the opening of the pixel defining layer 134. Electrons and holes are injected into the organic light-emitting layer 135 from the cathode 136 and the anode 133 respectively to form excitons in the organic light-emitting layer 135 and excite molecules of an organic light-emitting material, thereby enabling the organic light-emitting layer 135 to emit visible light. Since the visible light is emitted from the organic light-emitting layer 135, a region where the organic light-emitting layer 135 is located is the light-emitting region 23.

As shown in FIGS. 17 and 18, x denotes the length of the light-emitting region 23 along the first direction J. It is assumed that the boundary position of the virtual image spot falls exactly at the edge of the display region AA. Then the maximum value of $Shift_i$ is $Shift_N$, and $Shift_N = x/2$. In this case, in the second pixel unit 102 at the edge of the display region AA, the reverse extension line of the light emitted through the second light emission adjustment unit 242 at the edge on a side of the second light-emitting element 132 facing away from the center of the display region AA extends in the vertical direction; that is, the boundary position of the virtual image spot is right located at the edge of the display region AA.

Further, the maximum value of $CRA_i$ is $CRA_N$. $CRA_N = Shift_N/m = x/(2*m)$.

The maximum value of k is $k_{max}$. $k_{max} = CRA_N/(i*d) = CRA_N/(N*d) = x/(2m*N*d)$.

It can be seen that when $k = x/(2m*N*d)$, the boundary position of the virtual image spot is right located on the edge of the display region AA. In this case, the virtual image spot coincides with the display region AA.

When $k \leq x/(2m*N*d)$, the boundary position of the virtual image spot is located outside the edge of the display region AA. In this case, the virtual image spot covers the entire display region AA. No boundary of the virtual image spot can be seen in the display region AA, thereby making the display brightness of the display region AA more uniform and improving the display effect of the display apparatus 10.

With continued reference to FIG. 13, in this embodiment, the shift linear-variation region AA1 is disposed in the display region AA. The geometric center of the shift linear-variation region AA1 coincides with the geometric center of the display region AA. As mentioned above, with the arrangement in the central region AA1 that $k \leq x/(2m*N*d)$, the virtual image spot formed in the shift linear-variation region AA1 covers the entire display region AA so that no obvious boundary of the virtual image spot can be seen in the display region AA, making the display brightness of the display region AA more uniform and improving the display effect of the display apparatus 10.

It is to be noted that the configuration area of the shift linear-variation region AA1 may be configured according to actual requirements. It is to be understood that a larger area of the shift linear-variation region AA1 indicates more second pixel units 102 whose k values can be controlled to be less than or equal to $x/(2m*N*d)$ so that virtual image spots formed by more second pixel units 102 can cover the entire display region AA, thereby more contributing to improving the brightness uniformity of the display region AA.

Referring to FIG. 13, optionally, in another display apparatus according to this embodiment of the present disclosure, the display region further includes a shift non-linear-variation region AA2. In the shift non-linear-variation region AA2, shifts vary non-linearly with image heights of pixel units.

A variation trend of the shifts in the shift linear-variation region AA1 is the same as a variation trend of the shifts in the shift non-linear-variation region AA2. In each of the two regions, the shifts increase with the increase of the image heights of the pixel units A variation slope of the shifts in the shift linear-variation region AA1 is smaller than a variation slope of the shifts in the shift non-linear-variation region AA2. That is, the shifts increase slightly with the increase of the image heights of the pixel units in the shift linear-variation region AA1, and the shifts increase greatly with the increase of the image heights of the pixel units in the shift non-linear-variation region AA2.

With continued reference to FIG. 13, in the shift non-linear-variation region AA2 of the display region AA, an i-th pixel unit which is from the center of the display region along the first direction is one second pixel unit. A shift $Shift_i$ corresponding to the one second pixel unit satisfies the relationship below.

$$Shift_i = A1 * (i * d)^2 + B1 * (i * d) + C1.$$

A1, B1, and C1 are each a constant not equal to 0.

i is greater than 0 and less than N. N denotes the number of pixel units along the first direction.

d denotes the size of a pixel unit along the first direction.

Alternatively, $Shift_i = A2 * (i * d)^3 + B2 * (i * d)^2 + C2 * (i * d) + D2$.

A2, B2, C2, and D2 are each a constant not equal to 0.

i is greater than 0 and less than N. N denotes the number of pixel units along the first direction.

d denotes the size of a pixel unit along the first direction.

FIG. 19 is a diagram illustrating a correspondence relationship between main-optical-axis angles and image heights in a shift non-linear-variation region of a display apparatus according to an embodiment of the present disclosure. $Shift_i = m * CRA_i$. As shown in the figure, in the shift non-linear-variation region, the shifts of the pixel units vary non-linearly with the image heights so that the main-optical-axis angles CRA vary non-linearly with the image heights, guaranteeing that the emission angle of the main light of the second pixel unit in the shift non-linear-variation region AA2 more matches the light-receiving feature of the optical system. In this case, the optical system can receive more light at the large viewing angle, thereby increasing the relative brightness of the display apparatus at the large viewing angle, reducing a color cast difference at the large viewing angle, and alleviating a color cast at a screen viewing angle.

In this embodiment, a non-linear relationship between the shift of the i-th pixel unit and an image height of the i-th pixel unit may be as below.

$$Shift_i = A1 * (i * d)^2 + B1 * (i * d) + C1.$$

$$Shift_i = A2 * (i * d)^3 + B2 * (i * d)^2 + C2 * (i * d) + D2.$$

In an embodiment, it may be configured that A1=0.0665, that B1=−1.1054, and that C1=5.323. That is, shift=0.0665* $(i*d)^2$−1.1054*(i*d)+5.323.

In another embodiment, it may be configured that A2=−0.00211, that B2=0.08317, that C2=−0.75776, and that D2=2.5621. That is, shift=−0.00211*(i*d)³+0.08317* $(i*d)^2$−0.75776*(i*d)²+2.5621.

It is to be noted that A1, B1, C1, A2, B2, C2, and D2 are not limited to the preceding embodiments. Specific values of A1, B1, C1, A2, B2, C2, and D2 may be obtained through a fitting method according to CRA requirements in a position with the maximum image height and the relevant information of an edge region of the central region AA1, which is not specifically limited in embodiments of the present disclosure.

FIG. 20 is a diagram illustrating a correspondence relationship between main-optical-axis angles and image heights of a display apparatus according to an embodiment of the present disclosure. As shown in FIG. 20, exemplarily, a range with image heights from 0 mm to 8 mm is configured as the shift linear-variation region AA1, and a range with image heights from 8 mm to 12 mm is configured as the shift non-linear-variation region AA2.

In the shift linear-variation region AA1, the shifts vary linearly with the image heights of the pixel units along the first direction J. In this case, the main-optical-axis angles CRA of the corresponding pixel units vary linearly with the image heights. In the shift non-linear-variation region AA2, the shifts vary non-linearly with the image heights of the pixel units along the first direction J. In this case, the main-optical-axis angles CRA of the corresponding pixel units vary non-linearly with the image heights.

The variation trend of the shifts in the shift linear-variation region AA1 is the same as the variation trend of the shifts in the shift non-linear-variation region AA2. In each of the regions, the shifts increase gradually with the increase of the image heights.

The variation slope of the shifts in the shift linear-variation region AA1 is smaller than the variation slope of the shifts in the shift non-linear-variation region AA2. That is, the shifts increase slightly with the increase of the image heights in the shift linear-variation region AA1; that is to say, the main-optical-axis angles CRA increase slowly. The shifts increase greatly with the increase of the image heights in the shift non-linear-variation region AA2; that is to say, the main-optical-axis angles CRA increase greatly.

The shift linear-variation region AA1 mainly controls the speed of displacement to control the size of the virtual image spot so that a virtual image does not fall within the screen. In this case, no obvious boundary of the virtual image spot can be seen in the display region AA, making the display brightness of the display region AA more uniform and improving the display effect of the display apparatus 10. The shift non-linear-variation region AA2 may be adjusted properly in accordance with requirements of the optical system. The emission angle of the main light of the second pixel unit 102 in an edge region AA2 more matches the light-receiving feature of the optical system. In this case, the optical system can receive more light at the large viewing angle, thereby increasing the relative brightness of the display apparatus at the large viewing angle, reducing a color cast difference at the large viewing angle, and alleviating a color cast at a screen viewing angle.

In this embodiment, the size of the shift linear-variation region AA1 along the first direction is set to h1, and the size of the shift non-linear-variation region AA2 along the first direction J is set to h2. A ratio of h1 to h2 satisfies that 1≤h1/h2≤2. Accordingly, the area of the shift non-linear-variation region AA2 is relatively small while the area of the shift linear-variation region AA1 is relatively large.

It is to be noted that the ratio h1/h2 of the distance h1 between the edge of the central region AA1 and the center of the display region AA to the distance h2 between the edge of the display region AA to the center of the display region AA may be set according to actual requirements and is not limited to the preceding region.

FIG. 21 is a partial structural diagram of a display apparatus according to an embodiment of the present disclosure. FIG. 22 is a sectional view taken along a direction L-L' of FIG. 23. As shown in FIGS. 23 and 24, optionally, light emission adjustment units 24 include color filter blocks 50. The color filter blocks 50 include first color filter blocks 51 and second color filter blocks 52. Each first color filter block 51 serves as a first light emission adjustment unit 241 and each second color filter block 52 serves as a second light emission adjustment unit 242.

In this embodiment, the light emission adjustment units 24 may be the color filter blocks 50. In the first pixel unit 101, first color filter blocks 51 among the color filter blocks 50 serve as the first light emission adjustment units 241. In the second pixel unit 102, second color filter blocks 52 among the color filter blocks 50 serve as the second light emission adjustment units 242.

A color filter block 50 is located on the light emission side of a light-emitting element 13 and configured to filter the light emitted by the light-emitting element 13 to form colorful outgoing light, thereby implementing the color display of the pixel units or color optimization display.

In an embodiment, in the first pixel unit 101, each first color filter block 51 corresponds to a respective first light-emitting element 131 so that the light emitted by each first light-emitting element 131 is emitted through the respective first color filter block 51. The first color filter blocks 51 are configured to filter the light emitted by the first light-emitting elements 131 to form colorful outgoing light. In the second pixel unit 102, each second color filter block 52 corresponds to a respective second light-emitting element 132 so that the light emitted by each second light-emitting element 132 is emitted through the respective second color filter block 52. The second color filter blocks 52 are configured to filter the light emitted by the second light-emitting elements 132 to form colorful outgoing light.

A plurality of color filter blocks 50 in one pixel unit have different colors. Further, the color filter blocks 50 with different colors match each other to implement the color display of the pixel units or color optimization display.

With continued reference to FIGS. 21 and 22, adjacent color filter blocks 50 may be isolated by a black matrix. The black matrix 25 is made of a light-absorbing material or an opaque material and configured to divide the light from the adjacent color filter blocks 50.

In this embodiment, the color filter blocks 50 serve as the light emission adjustment units 24 so that functions of the preceding light emission adjustment units 24 are implemented. That is, the first pixel unit 101 includes a plurality of first light-emitting elements 131 and a plurality of first color filter blocks 51. The first light-emitting elements 131 are in one-to-one correspondence with the first color filter blocks 51. The light emitted by a first light-emitting element 131 is emitted through a first color filter block 51 corresponding to the first light-emitting element 131. The first light-emitting center 1310 of the first light-emitting element 131 coincides with the center (that is, the first light adjustment center 2410) of the first color filter block 51 corresponding to the first light-emitting element 131.

The second pixel unit 102 includes a plurality of second light-emitting elements 132 and a plurality of second color filter blocks 52. The second light-emitting elements 132 are in one-to-one correspondence with the second color filter blocks 52. The light emitted by a second light-emitting element 132 is emitted through a second color filter block 52 corresponding to the second light-emitting element 132. Along the direction (the direction J as shown in the figures) in which the first pixel unit 101 points to the second pixel unit 102, the center (that is, the second light adjustment center 2420) of the second color filter block 52 and the second light-emitting center 1320 of the second light-emitting element 132 corresponding to the second color filter block 52 are shifted from each other. The center of the second color filter block 52 is located on a side of the second light-emitting center 1320 facing away from the first light-emitting center 1310. With this arrangement, the second color filter block 52 is shifted toward a side away from the center of the display region AA so that the main optical axis of a beam emitted through the second color filter block 52 is inclined along the direction of the large viewing angle. That is, the emission angle of the main light of the second pixel unit 102 is inclined along the direction of the large viewing angle so that the emission angle of the main light of the second pixel unit 102 matches the light-receiving feature of the optical system, guaranteeing that the optical system can receive more light at the large viewing angle, thereby increasing the relative brightness of the display apparatus 10 at the large viewing angle, reducing a color cast difference at the large viewing angle, and alleviating a color cast at a screen viewing angle.

It is to be noted that any technical solution of the light emission adjustment units 24 in any preceding embodiment can be applied to the color filter blocks 50 so that the color filter blocks 50 have the technical effect of any technical solution in any preceding embodiment. Explanations of structures and terms the same as or corresponding to those in the preceding embodiments are not repeated here.

FIG. 23 is a partial structural diagram of another display apparatus according to an embodiment of the present disclosure. FIG. 24 is a sectional view taken along a direction M-M' of FIG. 23. As shown in FIGS. 23 and 24, optionally, light emission adjustment units 24 include microlenses 30. The microlenses 30 include first microlenses 31 and second microlenses 32. The microlenses 31 serve as a first light emission adjustment unit 241 and the second microlenses 32 serve as a second light emission adjustment unit 242.

In this embodiment, the light emission adjustment units 24 may be the microlenses 30. In the first pixel unit 101, first microlenses 31 among the microlenses 30 serve as the first light emission adjustment units 241. In the second pixel unit 102, second microlenses 32 among the microlenses 30 serve as the second light emission adjustment units 242.

A microlens 30 is located on the light emission side of a light-emitting element 13. A light beam emitted by the light-emitting element 13 is emitted through the microlens 30. The microlens 30 is configured to adjust the light emission direction of a pixel unit to enhance brightness.

In an embodiment, as shown in FIGS. 23 and 24, in the first pixel unit 101, each first microlens 31 corresponds to a respective first light-emitting element 131 so that the light emitted by each first light-emitting element 131 is emitted through the respective first microlens 31. Each first microlens 31 is configured to adjust the light emission direction of the respective first light-emitting element 131 to enhance brightness. In the second pixel unit 102, each second microlens 32 corresponds to a respective second light-emitting element 132 so that the light emitted by each second light-emitting element 132 is emitted through the respective second microlens 32. Each second microlens 32 is configured to adjust the light emission direction of the respective second light-emitting element 132 to enhance brightness.

In this embodiment, the microlenses 30 serve as the light emission adjustment units 24 so that functions of the preceding light emission adjustment units 24 are implemented. That is, the first pixel unit 100 includes a plurality of first light-emitting elements 131 and a plurality of first microlenses 31. The first light-emitting elements 131 are in one-to-one correspondence with the first microlenses 31. The light emitted by a first light-emitting element 131 is emitted through a first microlens 31 corresponding to the first light-emitting element 131. The first light-emitting center 1310 of the first light-emitting element 131 coincides with the center (that is, the first light adjustment center 2410) of the first microlens 31 corresponding to the first light-emitting element 131.

The second pixel unit 102 includes a plurality of second light-emitting elements 132 and a plurality of second microlenses 32. The second light-emitting elements 132 are in one-to-one correspondence with the second microlenses 32. The light emitted by a second light-emitting element 132 is emitted through a second microlens 32 corresponding to the second light-emitting element 132. Along the direction (the direction J as shown in the figures) in which the first pixel unit 101 points to the second pixel unit 102, the center (that is, the second light adjustment center 2420) of the second microlens 32 and the second light-emitting center 1320 of the second light-emitting element 132 corresponding to the second microlens 32 are shifted from each other. The center of the second microlens 32 is located on a side of the second light-emitting center 1320 facing away from the first light-emitting center 1310. With this arrangement, the second microlens 32 is shifted toward a side away from the center of the display region AA so that the main optical axis of a beam emitted through the second microlens 32 is inclined along the direction of the large viewing angle. That is, the emission angle of the main light of the second pixel unit 102 is inclined along the direction of the large viewing angle so that the emission angle of the main light of the second pixel unit 102 matches the light-receiving feature of the optical system, guaranteeing that the optical system can receive more light at the large viewing angle, thereby increasing the relative brightness of the display apparatus 10 at the large viewing angle, reducing a color cast difference at the large viewing angle, and alleviating a color cast at a screen viewing angle.

It is to be noted that any technical solution of the light emission adjustment units 24 in any preceding embodiment can be applied to the microlenses 30 so that the microlenses 30 have the technical effect of any technical solution in any preceding embodiment. Explanations of structures and terms the same as or corresponding to those in the preceding embodiments are not repeated here.

FIG. 25 is a partial structural diagram of another display apparatus according to an embodiment of the present disclosure. FIG. 26 is a sectional view taken along a direction P-P' of FIG. 25. As shown in FIGS. 25 and 26, optionally, light emission adjustment units 24 include color filter blocks 50 and microlenses 30. A microlens 30 is located on a side of a color filter block 50 facing away from a light-emitting element 13. The color filter blocks 50 include first color filter blocks 51 and second color filter blocks 52. The microlenses 30 include first microlenses 31 and second microlenses 32. A first color filter block 51 and a first microlens 31 serve as a first light emission adjustment unit 241. A second color filter block 52 and a second microlens 32 serve as a second light emission adjustment unit 242.

As shown in FIGS. 25 and 26, a microlens 30 is located on a side of a color filter block 50 facing away from a light-emitting element 13. A light beam emitted by the color filter block 50 is then emitted through the microlens 30. The microlens 30 is configured to adjust the light emission direction of the light-emitting element 13 to enhance brightness.

For a specific configuration manner of the microlenses 30 and the color filter blocks 50, refer to the preceding embodiments, which is not repeated here.

In this embodiment, the microlenses 30 and the color filter blocks 50 serve as the light emission adjustment units 24 so that functions of the preceding light emission adjustment units 24 are implemented.

In an embodiment, the first pixel unit 101 includes a plurality of first light-emitting elements 131 and a plurality of first color filter blocks 51. The first light-emitting elements 131 are in one-to-one correspondence with the first color filter blocks 51. The light emitted by a first light-emitting element 131 is emitted through a first color filter block 51 corresponding to the first light-emitting element 131. The first light-emitting center 1310 of the first light-emitting element 131 coincides with the center (that is, the first light adjustment center 2410) of the first color filter block 51 corresponding to the first light-emitting element 131. The second pixel unit 102 includes a plurality of second light-emitting elements 132 and a plurality of second color filter blocks 52. The second light-emitting elements 132 are in one-to-one correspondence with the second color filter blocks 52. The light emitted by a second light-emitting element 132 is emitted through a second color filter block 52 corresponding to the second light-emitting element 132. Along the direction (the direction J as shown in the figures) in which the first pixel unit 101 points to the second pixel unit 102, the center (that is, the second light adjustment center 2420) of the second color filter block 52 and the second light-emitting center 1320 of the second light-emitting element 132 corresponding to the second color filter block 52 are shifted from each other. The center of the second color filter block 52 is located on a side of the second light-emitting center 1320 facing away from the first light-emitting center 1310.

Moreover, the first pixel unit 101 includes a plurality of first light-emitting elements 131 and a plurality of first microlenses 31. The first light-emitting elements 131 are in one-to-one correspondence with the first microlenses 31. The light emitted by a first light-emitting element 131 is emitted through a first microlens 31 corresponding to the first light-emitting element 131. The first light-emitting center 1310 of the first light-emitting element 131 coincides with the center (that is, the first light adjustment center 2410) of the first microlens 31 corresponding to the first light-emitting element 131. The second pixel unit 102 includes a plurality of second light-emitting elements 132 and a plurality of second microlenses 32. The second light-emitting elements 132 are in one-to-one correspondence with the second microlenses 32. The light emitted by a second light-emitting element 132 is emitted through a second microlens 32 corresponding to the second light-emitting element 132. Along the direction (the direction J as shown in the figures) in which the first pixel unit 101 points to the second pixel unit 102, the center (that is, the second light adjustment center 2420) of the second microlens 32 and the second light-emitting center 1320 of the second light-emitting element 132 corresponding to the second microlens 32 are shifted from each other. The center of the second microlens 32 is located on a side of the second light-emitting center 1320 facing away from the first light-emitting center 1310.

Along the direction (the direction J as shown in the figures) in which the first pixel unit 101 points to the second pixel unit 102, the second color filter block 52 in the second pixel unit 102 and the second microlens 32 in the second pixel unit 102 are each shifted toward a side away from the center of the display region AA so that the main optical axis of a beam emitted through the second color filter block 52 and the second microlens 32 is inclined along the direction of the large viewing angle. That is, the emission angle of the main light of the second pixel unit 102 is inclined along the direction of the large viewing angle so that the emission angle of the main light of the second pixel unit 102 matches the light-receiving feature of the optical system, guaranteeing that the optical system can receive more light at the large viewing angle, thereby increasing the relative brightness of the display apparatus 10 at the large viewing angle, reducing a color cast difference at the large viewing angle, and alleviating a color cast at a screen viewing angle.

It is to be noted that FIGS. 23 and 26 merely illustrate an example in which the bottom surface of a microlens 30 is circular. In another embodiment, the microlens 30 may also be of another shape and is not limited to semi-ellipsoidal, semi-hemispherical, or of a spherical crown shape with a circular or elliptical bottom surface.

Additionally, the display apparatus according to this embodiment of the present disclosure may also include another layer located between the light-emitting element 13 and the light emission adjustment units 24 and may also include another layer located between the microlenses 30 and the color filter blocks 50, which are not shown. Those skilled in the art may configure another functional layer according to actual requirements.

Further, light-emitting elements 13 in a pixel unit 100 are a first color light-emitting element, a second color light-emitting element, and a third color light-emitting element. The first color light-emitting element, the second color light-emitting element, and the third color light-emitting element may be each a white light-emitting element. The white outgoing light is filtered through the color filter blocks 50 to implement color display. The arrangement in which the first color light-emitting element, the second color light-emitting element, and the third color light-emitting element in the pixel unit 100 only include white light-emitting elements simplifies the configuration manner of the light-emitting elements. In another embodiment, the first color light-emitting element in the pixel unit 100 may be a red light-emitting element, the second color light-emitting element may be a green light-emitting element, and the third color light-emitting element may be a blue light-emitting element. That is, color display is implemented through the colorful light-emitting elements. The colorful light-emitting elements are configured as the light-emitting elements directly, resulting in high color purity and guaranteeing the sound display effect of the display apparatus.

FIG. 27 is a diagram of a near-eye display device according to an embodiment of the present disclosure. The near-eye display device includes the display apparatus as described in any preceding embodiment. The near-eye display device according to this embodiment of the present disclosure may be an electronic display device such as a virtual reality (VR) device and an augmented reality (AR) device, which is not limited in embodiments of the present disclosure. Optionally, the display apparatus is a silicon-based OLED microdisplay apparatus.

The preceding embodiments do not limit the scope of the present disclosure. It is to be understood by those skilled in the art that various modifications, combinations, sub-combinations, and substitutions may be performed according to design requirements and other factors. Any modification, equivalent substitution, improvement, or the like made within the spirit and principle of the present disclosure is within the scope of the present disclosure.

What is claimed is:

1. A display apparatus, comprising a display region, wherein, the display region comprises a plurality of pixel units, each pixel unit among the plurality of pixel units comprises a plurality of light-emitting elements and a plurality of light emission adjustment units located on a light emission side of the plurality of light-emitting elements, and the plurality of light emission adjustment units are in one-to-one correspondence with the plurality of light-emitting elements;

the plurality of pixel units comprise a first pixel unit and at least one second pixel unit, the first pixel unit is located at a center of the display region, and the at least one second pixel unit is located on a side of the first pixel unit facing an edge of the display region;

for the first pixel unit, light-emitting elements in the first pixel unit are first light-emitting elements, light emission adjustment units in the first pixel unit are first light emission adjustment units, each of the first light-emitting elements comprises a first light-emitting center, each of the first light emission adjustment units comprises a first light adjustment center, and a first light-emitting center of a first light-emitting element among the first light-emitting elements coincides with a first light adjustment center of a respective first light emission adjustment unit, corresponding to the first light-emitting element, among the first light emission adjustment units;

for each of the at least one second pixel unit, light-emitting elements in each second pixel unit are second light-emitting elements; light emission adjustment units in each second pixel unit are second light emission adjustment units; each of the second light-emitting elements comprises a second light-emitting center; each of the second light emission adjustment units comprises a second light adjustment center; and along a first direction, a second light adjustment center of each second light emission adjustment unit among the second light emission adjustment units and a second light-emitting center of a respective second light-emitting element, corresponding to each second light emission adjustment unit, among the second light-emitting elements are shifted from each other with a shift; and the second light adjustment center of each second light emission adjustment unit is located on a side of the second light-emitting center, facing away from the first light-emitting center, of the respective second light-emitting element, the first direction is a direction in which the first pixel unit points to the second pixel unit;

the display region comprises a shift linear-variation region; and in the shift linear-variation region, shifts vary linearly with image heights of pixel units among the plurality of pixel units; and in the shift linear-variation region, a shift of an i-th pixel unit which is from the center of the display region along the first direction is that $\text{Shift}_i = n*(i*d)$, a relationship between the shift $\text{Shift}_i$ of the i-th pixel and a main-optical-axis angle of the i-th pixel is that $\text{Shift}_i = m*\text{CRA}_i$, and the main-optical-axis angle of the i-th pixel is that $\text{CRA}_i = k*(i*d)$, wherein i is greater than 0 and less than N, and N denotes a number of pixel units along the first direction and among the plurality of pixel units;

d denotes a size of one of the pixel units along the first direction;

n denotes a slope of the shifts varying with the image heights of the pixel units, and n is a constant not equal to 0;

k denotes a slope of main-optical-axis angles varying with the image heights, and k is a constant not equal to 0;

m denotes a slope of the shifts varying with the main-optical-axis angles, and m is a constant not equal to 0;

x denotes a size of a light-emitting region along the first direction; and $$k \leq x/(2m*N*d).$$

2. The display apparatus according to claim 1, wherein x denotes the size of the light-emitting region along the first direction; and the shift $\text{Shift}_i$ satisfies that $\text{Shift}_i \leq x/2$.

3. The display apparatus according to claim 1, wherein the display region further comprises a shift non-linear-variation region; and in the shift non-linear-variation region, shifts vary non-linearly with image heights of pixel units among the plurality of pixel units.

4. The display apparatus according to claim 3, wherein a variation trend of the shifts in the shift linear-variation region is same as a variation trend of the shifts in the shift non-linear-variation region.

5. The display apparatus according to claim 3, wherein a variation slope of the shifts in the shift linear-variation region is smaller than a variation slope of the shifts in the shift non-linear-variation region.

6. The display apparatus according to claim 3, wherein in the shift non-linear-variation region, an i-th pixel unit which is from the center of the display region along the first direction is one second pixel unit, and a shift $\text{Shift}_i$ corresponding to the one second pixel unit satisfies a following relationship:

$\text{Shift}_i = A1*(i*d)^2 + B1*(i*d) + C1$, wherein A1, B1, and C1 are each a constant not equal to 0.

7. The display apparatus according to claim 6, wherein A1 is 0.0665, B1 is −1.1054, and C1 is 5.323.

8. The display apparatus according to claim 3, wherein in the shift non-linear-variation region, an i-th pixel unit which is from the center of the display region along the first direction is one second pixel unit, and a shift $\text{Shift}_i$ corresponding to the one second pixel unit satisfies a following relationship:

$\text{Shift}_i = A2*(i*d)^3 + B2*(i*d)^2 + C2*(i*d) + D2$, wherein A2, B2, C2, and D2 are each a constant not equal to 0.

9. The display apparatus according to claim 8, wherein A2 is −0.00211, B2 is 0.08317, C2 is −0.75776, and D2 is 2.5621.

10. The display apparatus according to claim 3, wherein from the center of the display region to the edge of the display region along the first direction, h1 denotes a size of the shift linear-variation region, and h2 denotes a size of the shift non-linear-variation region, wherein $1 \leq h1/h2 \leq 2$.

11. The display apparatus according to claim 3, wherein the shift non-linear-variation region is disposed around the shift linear-variation region.

12. The display apparatus according to claim 1, wherein each pixel unit comprises a plurality of sub-pixel units, and a plurality of sub-pixel units of one pixel unit among the plurality of pixel units have a same shift.

13. The display apparatus according to claim 1, wherein
the plurality of light emission adjustment units comprise a plurality of color filter blocks; and
the plurality of color filter blocks comprise a plurality of first color filter blocks serving as a first light emission adjustment unit and a plurality of second color filter block serving as a second light emission adjustment unit.

14. The display apparatus according to claim 1, wherein
the plurality of light emission adjustment units comprise a plurality of microlenses; and
the plurality of microlenses comprise a plurality of first microlenses serving as a first light emission adjustment unit and a plurality of second microlenses serving as a second light emission adjustment unit.

15. The display apparatus according to claim 1, wherein
the plurality of light emission adjustment units comprise a plurality of color filter blocks and a plurality of microlenses;
the plurality of microlenses are located on a side of the plurality of color filter blocks facing away from the plurality of light-emitting elements; and
the plurality of color filter blocks comprise a plurality of first color filter blocks and a plurality of second color filter blocks, the plurality of microlenses comprise a plurality of first microlenses and a plurality of second microlenses, the plurality of first color filter blocks and the plurality of first microlenses serve as a first light emission adjustment unit, and the plurality of second color filter blocks and the plurality of second microlenses serve as a second light emission adjustment unit.

16. A near-eye display device, comprising the display apparatus according to claim 1.

17. The near-eye display device according to claim 16, wherein the display apparatus is a silicon-based OLED microdisplay apparatus.

* * * * *